(12) United States Patent
Yano et al.

(10) Patent No.: US 9,029,275 B2
(45) Date of Patent: May 12, 2015

(54) NANOFIBER SHEET, PROCESS FOR PRODUCING THE SAME, AND FIBER-REINFORCED COMPOSITE MATERIAL

(75) Inventors: Hiroyuki Yano, Kyoto (JP); Masaya Nogi, Kyoto (JP); Shinsuke Ifuku, Kyoto (JP); Kentarou Abe, Kyoto (JP); Keishin Handa, Kanagawa (JP)

(73) Assignees: Mitsubishi Chemical Corporation, Tokyo (JP); Rohm Co., Ltd., Kyoto-shi (JP)

( * ) Notice: Subject to any disclaimer, the term of this patent is extended or adjusted under 35 U.S.C. 154(b) by 1056 days.

(21) Appl. No.: 12/374,220

(22) PCT Filed: Jul. 13, 2007

(86) PCT No.: PCT/JP2007/063980
§ 371 (c)(1),
(2), (4) Date: Jan. 16, 2009

(87) PCT Pub. No.: WO2008/010462
PCT Pub. Date: Jan. 24, 2008

(65) Prior Publication Data
US 2009/0264036 A1   Oct. 22, 2009

(30) Foreign Application Priority Data
Jul. 19, 2006  (JP) ................................. 2006-197106

(51) Int. Cl.
*B32B 23/02* (2006.01)
*H05K 1/03* (2006.01)
*D21H 11/08* (2006.01)

(52) U.S. Cl.
CPC .............. *H05K 1/0366* (2013.01); *D21H 11/08* (2013.01); *H05K 2201/0251* (2013.01); *H05K 2201/0284* (2013.01)

(58) Field of Classification Search
CPC ..................................................... D21H 11/08
USPC .......................................... 442/165; 424/488
See application file for complete search history.

(56) References Cited

U.S. PATENT DOCUMENTS

| 5,591,304 A | 1/1997 | Tolan et al. |
| 2005/0067730 A1 | 3/2005 | Yano et al. |
| 2006/0182941 A1 | 8/2006 | Yano et al. |

FOREIGN PATENT DOCUMENTS

| CA | 2 437 616 | 2/2005 |
| EP | 1 650 253 | 4/2006 |
| JP | 6 166977 | 6/1994 |
| JP | 2003 201695 | 7/2003 |
| JP | 2005 60680 | 3/2005 |

OTHER PUBLICATIONS

Office Action issued Jan. 7, 2013 in European Patent Application No. 07 790 761.6.
Office Action issued Sep. 10, 2013 in European Application No. 07 790 761.6.
Supplementary European Search Report dated Apr. 26, 2012.

*Primary Examiner* — Jake Vu
(74) *Attorney, Agent, or Firm* — Oblon, McClelland, Maier & Neustadt, L.L.P.

(57) ABSTRACT

Provided is a nanofiber sheet that sufficiently refined by fibrillation and has high crystallinity of cellulose fiber and can realize a fiber-reinforced composite material exhibiting high transparency, a high elastic modulus, a low coefficient of linear thermal expansion, and high heat resistance and being high in flatness and smoothness. This nanofiber sheet includes crystalline cellulose as the main component and a lignin in an amount of from 10 ppm to 10 wt %. When a fiber/resin composite material obtained by impregnating the nanofiber sheet with tricyclodecane dimethacrylate, subjecting the impregnated product to UV-curing at 20 J/cm$^2$, and heating the cured product in vacuum at 160° C. for two hours includes 60 wt % of the cured tricyclodecane dimethacrylate and 40 wt % of nanofiber, the following physical characteristics (i) to (iii) are satisfied: (i) the parallel light transmittance of light of a wavelength of 600 nm at a sheet thickness of 100 μm is 70% or more; (ii) the Young's modulus is 5.0 GPa or more; and (iii) the coefficient of linear thermal expansion is 20 ppm/K or less.

18 Claims, No Drawings

NANOFIBER SHEET, PROCESS FOR PRODUCING THE SAME, AND FIBER-REINFORCED COMPOSITE MATERIAL

FIELD OF INVENTION

The present invention relates to a nanofiber nonwoven fabric (hereinafter, referred to as "nanofiber sheet") and a method of producing the same.

The present invention also relates to a fiber-reinforced composite material composed of the nanofiber sheet impregnated with a matrix material.

BACKGROUND OF INVENTION

Glass fiber-reinforced resins, which are glass fibers impregnated with resins, are most common fiber-reinforced composite materials. In general, the glass fiber-reinforced resins are opaque. Patent Documents 1 and 2 each disclose a method for preparing a transparent glass fiber-reinforced resin by conforming the refractive index of a glass fiber and the refractive index of a matrix resin.

Transparent flexible substrates used for mounting LEDs or organic electronic devices are required to have, for example, low thermal expansion, high strength, high flexibility, and lightweight properties. However, though glass fiber-reinforced resin substrates can satisfy the low thermal expansion and high strength, the satisfactory lightweight properties are not achieved. In addition, since common glass fiber reinforcement provides a fiber diameter in the order of micrometer, the transparency is not achieved under conditions other than specific atmospheric temperature and specific wavelengths. That is, the practical transparency is insufficient. Furthermore, it is known that deteriorations in flatness and smoothness of the surface disadvantageously occur with a change in atmospheric temperature are known.

Japanese Unexamined Patent Application Publication No. 2005-60680 of the present applicant discloses a fiber-reinforced composite material showing excellent transparency regardless of temperature and wavelengths in the visible range and less affected by the refractive index of a resin material used together, and being excellent in surface smoothness and having low thermal expansion, high strength, a low weight, and containing a fiber with an average fiber diameter of 4 to 200 nm and a matrix material as a flexible fiber-reinforced composite substrate material, and has a light transmittance of 60% or more at wavelength of 400 to 700 nm in 50 μm thickness conversion.

Japanese Unexamined Patent Application Publication No. 2005-60680 discloses a sheet that is produced by impregnating a cellulose fiber produced by bacteria (hereinafter, referred to as "bacterial cellulose") or a microfibrillated cellulose fiber prepared by fibrillating, for example, pulp or cotton with a matrix material.

Japanese Unexamined Patent Application Publication No. 2003-155349 proposes an ultrafine fiber obtained by fibrillating a natural fiber, such as a cellulose fiber, in a suspended form between two rotating disks. Japanese Unexamined Patent Application Publication No. 2003-155349 discloses a process for refining fiber by repeating mechanical fibrillation treatment 10 to 20 times.

In order to obtain a highly transparent fiber-reinforced composite material by impregnating a fine fiber sheet with a matrix material as disclosed in Japanese Unexamined Patent Application Publication Nos. 2005-60680 and 2003-155349, the fiber forming a sheet is required to be sufficiently fibrillated (nano-scale fibrillation). In order to obtain a fiber-reinforced composite material with a high elastic modulus and a low coefficient of linear thermal expansion, the crystalline cellulose constituting the fiber is required not to be broken by fibrillation and to retain a high crystallinity state.

[Patent Document 1] Japanese Unexamined Patent Application Publication No. 9-207234
[Patent Document 2] Japanese Unexamined Patent Application Publication No. 7-156279
[Patent Document 3] Japanese Unexamined Patent Application Publication No. 2005-60680
[Patent Document 4] Japanese Unexamined Patent Application Publication No. 2006-22922
[Patent Document 5] Japanese Unexamined Patent Application Publication No. 2003-155349

The bacterial cellulose and the nanofiber using pulp or cotton as a raw material described in Japanese Unexamined Patent Application Publication No. 2005-60680 have the following defects.

In the bacterial cellulose, the network of the fiber is not formed by tangles of the fiber itself, but is mainly formed by branching. Consequently, the network is not fibrillated and is tangled, resulting in difficulty in the fibrillation. In addition, since the network of the fiber is thus mainly formed by branching, it is difficult to produce a uniform sheet without a wave and a warp. The resulting fiber-reinforced composite material has a high birefringence.

The bacterial cellulose requires a long time for culturing, resulting in an increase in cost.

In the nanofiber made by using pulp as a raw material, the pulp itself is dried. In the nanofiber that is dried before fibrillation, hydrogen bonds develop between nanofiber molecules and between cellulose crystals inside the nanofiber. As a result, nano-scale fibrillation by mechanical treatment is difficult. The nano-scale fibrillation by increasing fibrillation treatment time, strength, and frequency to raise the degree of fibrillation treatment breaks crystalline cellulose, resulting in a decrease in crystallinity. This increases the coefficient of linear thermal expansion of the fiber-reinforced composite material and decreases the Young's modulus.

Furthermore, since cotton itself does not contain lignin and hemicellulose, the nanofiber made by using cotton as a raw material is low in mechanical fibrillation efficiency because of reasons described below. The nano-scale fibrillation by increasing fibrillation treatment time, strength, and frequency to raise the degree of fibrillation treatment breaks crystalline cellulose, resulting in a decrease in crystallinity, as in the nanofiber made of pulp. This increases the coefficient of linear thermal expansion of the fiber-reinforced composite material and decreases the elastic modulus.

That is, since cotton itself does not contain lignin and hemicellulose at all, it is unnecessary to remove lignin. Therefore, gaps, which are caused by the removal of lignin, are not formed, resulting in no perforation of the fiber. Consequently, gaps as a trigger for mechanical fibrillation are not formed. In addition, because of no residual lignin, the plasticization effect of lignin between fiber molecules cannot be expected. Therefore, the efficiency of the mechanical fibrillation is low.

Thus, in nanofiber made from pulp or cotton, it is difficult to simultaneously achieve high transparency, a low coefficient of linear thermal expansion, and a high Young's modulus by a transparent composite material composed of the nanofiber and a transparent resin.

Furthermore, since the fine fiber described in Japanese Unexamined Patent Application Publication No. 2003-155349 is refined by repeating fibrillation treatment 10 to 20 times, breakage of crystalline cellulose is caused. Consequently, the coefficient of linear thermal expansion of the resulting fiber-reinforced composite material is increased. In Japanese Unexamined Patent Application Publication No. 2003-155349, since lignin is not removed before the fibrillation treatment, hydrogen bonds develop between nanofiber molecules, and perforation of the fiber derived by gaps, which are caused by the removal of lignin, are not formed, as described above. It is thought that since the fibrillation efficiency is low, the fibrillation is necessarily repeated. The nanofiber where lignin is not removed has low heat resistance, and, for example, the residual lignin is changed in color if the nanofiber is exposed to high temperature conditions even in an inert atmosphere or a vacuum atmosphere.

SUMMARY OF INVENTION

It is an object of the present invention to solve the above-mentioned conventional problems and to inexpensively provide a nanofiber sheet that is sufficiently refined by fibrillation and can realize a fiber-reinforced composite material having high cellulose fiber crystallinity, high transparency, a high elastic modulus, a low coefficient of linear thermal expansion, and high heat resistance and being high in flatness and smoothness.

It is also an object of the present invention to provide a fiber-reinforced composite material composed of the nanofiber sheet impregnated with a matrix material.

The present invention provides the following nanofiber sheet, a method of producing the same, and a fiber-reinforced composite material:

[1] A nanofiber nonwoven fabric (hereinafter, referred to as "nanofiber sheet") including:
  crystalline cellulose as a main component; and
  10 ppm or more and 10 wt % or less of lignin,
  wherein when a fiber/resin composite material is prepared by impregnating the nanofiber sheet with tricyclodecane dimethacrylate, subjecting the impregnated product to UV-curing at 20 J/cm$^2$, and heating the cured product in vacuum at 160° C. for two hours such that the fiber/resin composite material is composed of 60 wt % of cured tricyclodecane dimethacrylate and 40 wt % of nanofiber, the fiber/resin composite material satisfies the following physical characteristics (i) to (iii):
  (i) the parallel light transmittance of light of a wavelength of 600 nm at a sheet thickness of 100 μm is 70% or more;
  (ii) the Young's modulus is 5.0 GPa or more; and
  (iii) the coefficient of linear thermal expansion is 20 ppm/K or less;
[2] The nanofiber sheet in the above [1], wherein the nanofiber is obtained from wood flour;
[3] The nanofiber sheet according to the above [1] or [2], wherein a part of the hydroxyl groups of the nanofiber is chemically modified;
[4] The nanofiber sheet according to the above [3], wherein the chemical modification is acylation;
[5] The nanofiber sheet according to the above [3] or [4], wherein the degree of substitution in the nanofiber by the chemical modification is 0.05 to 1.2;
[6] A method of producing a nanofiber sheet according to any one of the above [1] to [5] comprising a step of mechanically fibrillating a nanofiber precursor, wherein the nanofiber precursor contains 3 wt % or more water in all steps prior to the fibrillation;
[7] The method of producing a nanofiber sheet according to the above [6], wherein a nanofiber precursor solution or dispersion containing 0.1 to 5 wt % solid content is mechanically fibrillated to give nanofiber;
[8] The method of producing a nanofiber sheet according to the above [7], wherein the fibrillation step is carried out after a step of removing lignin by immersing the nanofiber precursor in an oxidizer;
[9] The method of producing a nanofiber sheet according to the above [8], wherein the oxidizer is a sodium chlorite aqueous solution;
[10] The method of producing a nanofiber sheet according to any one of the above [6] to [9], the fibrillation step is grinding treatment;
[11] The method of producing a nanofiber sheet according to the above [10], wherein the grinding treatment is carried out by using plate-like grind stones with a diameter of 10 cm or more facing to each other with a clearance of 1 mm or less under conditions including a revolution number of the grind stones of 500 rpm or more and a detention time of the nanofiber precursor between the grind stones of one to thirty minutes;
[12] The method of producing a nanofiber sheet according to any one of the above [6] to [11], the method comprising a drying step of drying the nanofiber obtained in the fibrillation step to an amount of water of less than 3 wt %;
[13] The method of producing a nanofiber sheet according to any one of the above [6] to [12], the method comprising a hemicellulose-removing step of immersing the nanofiber precursor in an alkali;
[14] The method of producing a nanofiber sheet according to the above [13], wherein the alkali is a potassium hydroxide aqueous solution;
[15] The method of producing a nanofiber sheet according to any one of the above [6] to [14], the method including a papermaking step of papermaking the nanofiber obtained in the fibrillation step;
[16] The method of producing a nanofiber sheet according to the above [15], the method including a chemical modification step of chemically modifying a part of the hydroxyl groups of the nanofiber obtained in the fibrillation step;
[17] A fiber-reinforced composite material including a nanofiber sheet according to any one of the above [1] to [5] impregnated with a matrix material;
[18] The fiber-reinforced composite material according to the above [17], wherein the matrix material is an amorphous synthetic resin having a glass transition temperature of 100° C. or more and a parallel light transmittance of 60% or more at a thickness of 100 μm; and
[19] The fiber-reinforced composite material according to the above [18], wherein the amorphous synthetic resin has a Young's modulus that is lower than that of the nanofiber sheet and is in the range of 0.5 to 6 GPa and a coefficient of linear thermal expansion that is higher than that of the nanofiber sheet and is in the range of 20 to 140 ppm/K.

DETAILED DESCRIPTION OF THE INVENTION

The present inventors have conducted intensive studies for solving the above-mentioned problems and, as a result, have found that, the fibrillation efficiency of a nanofiber precursor in the production of nanofiber by fibrillation of a nanofiber precursor can be increased such that the nanofiber can be readily prepared without excess fibrillation that breaks crystalline cellulose by not drying the nanofiber precursor before the fibrillation and fibrillating the nanofiber in the state containing a certain amount of water and preferably removing a part of lignin in the nanofiber precursor, and thereby that high transparency and a high Young's modulus and a low coefficient of linear thermal expansion can be simultaneously achieved.

The present invention has been made based on such findings.

The nanofiber sheet of the present invention includes crystalline cellulose as a main component and therefore has a high elastic modulus and a low coefficient of linear thermal expansion. In addition, since lignin is removed to a certain concentration range, the fibrillation efficiency is increased. Consequently, a fiber-reinforced composite material with high transparency can be prepared, and the material is also excellent in heat resistance.

In the method of producing the nanofiber sheet of the present invention, since a nanofiber precursor containing a certain amount of water is mechanically fibrillated, the nanofiber precursor can be efficiently fibrillated. Therefore, nanofiber that can ensure sufficient transparency can be prepared without excess fibrillation that may break crystalline cellulose. Accordingly, a fiber-reinforced composite material composed of the nanofiber sheet of the present invention impregnated with a matrix material is useful in many applications because of its high transparency, high elastic modulus, and low linear thermal expansion. In particular, a fiber/resin composite material prepared by using an amorphous synthetic resin as the matrix material has high strength and a low specific gravity and is therefore effective as, for example, a substrate material such as a wiring substrate, a window material for mobile objects, a base sheet for organic devices, in particular, a sheet for flexible OLEDs, and a surface-emitting lighting sheet. Furthermore, the fiber/resin composite material can be applied to flexible optical waveguide substrates and LCD substrates and is effective for producing inorganic materials, metal materials, or precise structures on sheets, such as transistors, transparent electrodes, passivation layers, gas-barrier films, and metal films, in particular, useful for production by a roll-to-roll process.

Embodiments of the present invention will now be described in detail.

[Property Value of Each Material]

The details and methods for measuring property values of each material and other characteristics regulated in the present invention are shown below. The specific methods are described in Examples.

1) Parallel Light Transmittance

The parallel light transmittance of a fiber/resin composite material composed of a nanofiber sheet impregnated with tricyclodecane dimethacrylate is a parallel light transmittance (straight light transmittance) when a molded plate with a thickness of 100 μm is irradiated with light of a wavelength of 600 nm in the thickness direction. The molded plate is prepared by impregnating a nanofiber sheet with tricyclodecane dimethacrylate such that the amount of tricyclodecane dimethacrylate is 60 wt % and the amount of the nanofiber is 40 wt % according to the method described in Examples below, subjecting the impregnated product to UV-curing at 20 J/cm$^2$, and heating the cured product at 160° C. for 2 hours in vacuum. The parallel light transmittance can be determined by disposing a light source and a detector so as to have a substrate (sample substrate) to be tested therebetween and be perpendicular to the substrate and measuring parallel light (straight transmitted light) using air as a reference.

The parallel light transmittances of the nanofiber sheet and the amorphous synthetic resin each having a thickness of 100 μm can be measured in a similar manner.

2) Young's Modulus

A sample having a width of 5 mm, a length of 50 mm, and a thickness of 100 μm was subjected to a tensile test at a deformation rate of 5 mm/min according to JIS K7113, ASTMD638, and the stress to strain in the region not higher than the proportional limit is determined.

3) Coefficient of Linear Thermal Expansion

The coefficient of linear thermal expansion is a value when the temperature of a sample is increased from 20° C. to 150° C. and is measured under conditions regulated in ASTM D696.

4) Cellulose Crystallinity of Nanofiber

The cellulose crystallinity of nanofiber is defined as a rate of crystalline scattering peak area on an X-ray diffraction graph obtained by X-ray diffraction measurement. A nanofiber sheet prepared is mounted on a sample holder, and an X-ray diffraction graph is drawn by measuring the X-ray diffraction in the diffraction angle range of 10° to 32°. The area defined by removing background scattering from the X-ray diffraction graph and connecting the points of 10°, 18.50, and 32° on the X-ray diffraction curve with straight lines corresponds to the amorphous portion, and the portion other than the amorphous portion is crystalline portion.

The cellulose crystallinity of nanofiber is the rate of a crystalline portion area to the total area of the entire diffraction graph and is calculated by the following equation:

Crystallinity=(crystalline portion area)/(total area of X-ray diffraction graph)×100(%).

5) Crystallinity of Amorphous Synthetic Resin

The crystallinity of an amorphous synthetic resin is determined by a density method in which the crystallinity is calculated from the densities of the amorphous portion and the crystalline portion.

6) Glass Transition Temperature (Tg) of Resin

The glass transition temperature is measured by a DSC method.

7) Fiber Occupancy of Nanofiber Sheet

The fiber occupancy is calculated by the following equation:

Fiber occupancy(volume %)=[(weight of nanofiber sheet)/(density of nanofiber)]/(volume of nanofiber sheet)×100

[Note] Volume of nanofiber sheet=(plane area of nanofiber sheet)×thickness     [Equation 1]

8) Water Content

A sample is heated to absolute dry according to need, and the water content is determined based on the difference in weight before and after the heating.

For example, wood flour cannot be dried to an absolute dry state at ambient temperature and is therefore heated. Specifically, since the wood flour is completely dried by being left standing in an oven of 105° C. overnight, the amount of water can be determined based on the difference in weight before and after the heating.

9) Quantitative Determination of Lignin

Lignin is measured by a sulfuric acid method as in below.

The weights of a weighing bottle and a glass filter are measured (total weight of the glass filter and the weighing bottle: Mg). A sample of about one gram is precisely weighed (sample weight: Mr) and is transferred to a 100-mL beaker. Then, 15 mL of 72% sulfuric acid of about 20° C. is added to the beaker, followed by sufficient stirring. The mixture is left standing at 20° C. for 4 hours and then transferred to a 1000-mL conical flask while washing with 560 mL of distilled water. A reflux cooling tube is attached to the conical flask, and the mixture is refluxed for four hours. After standing to cool, the content in the flask is suction-filtered with a glass filter and then washed with 500 mL of hot water. The glass filter is transferred to a weighing bottle and dried to a constant mass at 105° C., and the weight is measured (measurement weight: Mn).

The amount of lignin is determined by the following equation:

Lignin content(wt %)=$(Mn-Mg)/Mr \times 100$.

10) Quantitative Determination of Hemicellulose

The quantitative determination is carried out as follows:

A sample of about one gram is precisely weighed (sample weight: Mh) and is put in a 200-mL beaker, and 25 mL of 17.5 wt % sodium hydroxide solution of 20° C. is added thereto to uniformly moisturize the sample. The sample is left standing for four minutes and then squashed with a glass rod for five minutes for sufficient dissociation in order to uniformly absorb the alkali solution. The beaker is covered with a watch glass and left standing. The above process is carried out in a constant temperature bath of 20° C.

At the time 30 minutes after the addition of the sodium hydroxide aqueous solution, distilled water of 20° C. is further added to the beaker while stirring with a glass rod. After continuously stirring for additional one minute, the beaker is left in a constant-temperature bath of 20° C. for five minutes. The sample is suction-filtered with a glass filter of which weight has been measured. The filtrate is returned to the beaker and then filtered again (filtration is completed within five minutes). The sample is washed with distilled water within five minutes while squeezing with a glass rod. The end point of washing is neutrality indicated by phenolphthalein. Then, 40 mL of 10 wt % acetic acid is poured to the residue after the washing, and the mixture is left standing for five minutes and subjected to aspiration. After washing with one liter of distilled water, the residue was dried to a constant mass at 105° C., and the weight is measured (measurement value: Mz). The amount of hemicellulose is determined by the following equation:

Hemicellulose content(wt %)=$(Mh-Mz)/Mh \times 100$.

11) Degree of Substitution of Hydroxyl Group by Chemical Modification

The degree of substitution indicating the degree of chemical modification of hydroxyl groups of nanofiber is the number of substitutes introduced to three hydroxyl groups of an anhydroglucose unit. For example, the degree of substitution (DS) with acetyl groups is calculated by the following equation:

DS=[(sheet weight after reaction)/(sheet weight before reaction)$\times 162.14 - 162.14$]/42.

The weight of each sheet is calculated as a value of cellulose sheet from which lignin and hemicellulose are removed.

12) Size of Wood Flour

The major axis and the ratio of major axis to the minor axis are determined as follows:

The major axis is measured by observation of a sample with a microscope.

Similarly, the minor axis is measured, and the ratio of the major axis to the minor axis is calculated based on the results.

The minor axis can be also measured by passing the sample through a mesh with a predetermined size. Furthermore, if the measurement of size of wood flour is difficult due to aggregation, the measurement can be carried out after drying thereof.

13) Fiber Content of Fiber-Reinforced Composite Material

The amount of fiber of a fiber-reinforced composite material can be determined based on the weight of a matrix material and the weight of a nanofiber sheet used for producing the fiber-reinforced composite material.

[Nanofiber Sheet]

The nanofiber sheet of the present invention contains crystalline cellulose as a main component. The amount of lignin in the nanofiber sheet is 10 ppm or more and 10 wt % or less. A fiber/resin composite material (hereinafter, referred to as "TCDDMA(60)/NF(40)") that is prepared by impregnating the nanofiber sheet with tricyclodecane dimethacrylate such that the amount of tricyclodecane dimethacrylate (TCD-DMA) is 60 wt % and the amount of the nanofiber is 40 wt %, subjecting the impregnated product to UV-curing at 20 J/cm$^2$, and heating the cured product at 160° C. for 2 hours in vacuum satisfies the following physical characteristics i) to iii):

i) a parallel light transmittance of light of a wavelength of 600 nm at a sheet thickness of 100 μm is 70% or more;

ii) Young's modulus is 5.0 GPa or more; and iii) a coefficient of linear thermal expansion is 20 ppm/K or less.

[Crystalline Cellulose Content]

In the present invention, the phrase that a nanofiber sheet "contains crystalline cellulose as a main component" means that the amount of crystalline cellulose, namely, the cellulose crystallinity of the nanofiber sheet, is 40% or more. Preferably, the amount of crystalline cellulose is 50% or more. A smaller amount of crystalline cellulose in the nanofiber sheet cannot achieve sufficiently high elastic modulus and cannot achieve sufficiently low coefficient of linear thermal expansion. The crystalline cellulose is also effective for increasing thermal conductivity. A nanofiber sheet with high cellulose crystallinity can have a high coefficient of thermal conductivity. The upper limit of the cellulose crystallinity of the nanofiber sheet is not particularly limited. However, the end and the periphery of fiber have disorder in the crystalline structure into an amorphous state and also contain non-cellulose materials such as lignin and hemicellulose. Therefore, the cellulose crystallinity cannot be 100% and is practically 90% or less and preferably 80% or less.

[Lignin Content]

If the amount of lignin in a nanofiber sheet is high and the removal of lignin by a lignin-removing process described below is insufficient, gaps formed by the removal of lignin cannot sufficiently increase mechanical fibrillation efficiency as a trigger for mechanical fibrillation.

In a nanofiber sheet containing 10 wt % or more of lignin, the residual lignin causes a change in color by treatment at a high temperature of 180° C. or more, which is disadvantageous. The treatment at a high temperature of 180° C. or more is heating treatment that is usually required in, for example, a step of forming a transparent conductive film, a printing step in photolithography, drying/curing of a coated transparent material or luminescent material, or removing of low molecular weight components or residual solvents. Accordingly, the resistance to a heat of 180° C. or more is an important characteristic when the nanofiber sheet is used as an organic device substrate material or a transparent material. Therefore, the amount of lignin in the nanofiber sheet is limited to 10 wt % or less.

At the same time, lignin also achieves a plasticization effect in the mechanical fibrillation step described below. Accordingly, a certain amount of lignin is necessary for increasing the mechanical fibrillation effect. When the amount of lignin is 10 ppm or less, the nano-scale fibrillation by mechanical fibrillation tends to become insufficient. Therefore, in the present invention, the nanofiber sheet must contain 10 ppm or more of lignin.

The lower limit of the amount of lignin in the nanofiber sheet is preferably 20 ppm or more, more preferably 50 ppm or more, and most preferably 100 ppm or more, and the upper limit is 7 wt % or less and more preferably 5 wt % or less.

[Hemicellulose Content]

In the nanofiber sheet of the present invention, the amount of hemicellulose is not particularly limited. An application of a nanofiber sheet containing a large amount of hemicellulose to a transparent composite causes problems that the decrease in the coefficient of thermal expansion is insufficient, the elastic modulus is decreased, and the coefficient of thermal conductivity is decreased. On the other hand, a small amount of hemicellulose readily leads to insufficient fibrillation, though the degree is not so high as in the case of admixture of lignin, by the same mechanism. Accordingly, the amount of hemicellulose is preferably 10 wt % or less and most preferably 7 wt % or less and preferably 100 ppm or more and most preferably 200 ppm or more.

[Chemical Modification]

In the nanofiber of the nanofiber sheet of the present invention, a part of hydroxyl groups may be chemically modified. The chemical modification of the hydroxyl groups can increase the heat resistance and the decomposition temperature, prevent change in color, decrease the coefficient of linear thermal expansion, and decrease the hygroscopicity.

The substituents introduced into hydroxyl groups by chemical modification are not particularly limited. Examples of the substituents include an acetyl group, a propanoyl group, a butanoyl group, an iso-butanoyl group, a pentanoyl group, a hexanoyl group, a heptanoyl group, an octanoyl group, a nonanoyl group, a decanoyl group, an undecanoyl group, a dodecanoyl group, a myristoyl group, a palmitoyl group, a stearoyl group, and a pivaloyl group, and one or more of these groups are used. Preferred is acylation.

In an excessively low degree of substitution of the hydroxyl groups by chemical modification, the increase in heat resistance and the decrease in hygroscopicity by the chemical modification are not sufficiently achieved. On the other hand, a higher degree of substitution may break the crystalline cellulose of the nanofiber during the chemical modification treatment. Accordingly, the degree of substitution is preferably 1.2 or less, more preferably 0.8 or less, and most preferably 0.6 or less and preferably 0.05 or more, more preferably 0.2 or more, and most preferably 0.4 or more.

[Other Physical Characteristics of Nanofiber Sheet]

Other favorable physical characteristics of the nanofiber sheet of the present invention are, for example, as follows:

Coefficient of linear thermal expansion: 20 ppm/K or less, preferably 15 ppm/K or less, more preferably 10 ppm/K or less, and most preferably 5 ppm/K or less, Young's modulus: 4 GPa or more, preferably 5 GPa or more, more preferably 7 GPa or more, and most preferably 12 GPa or more, Fiber occupancy: 5 to 70% and preferably 20 to 50%, and Parallel light transmittance: in a thickness of 100 μm, 12% or more, preferably 15% or more, more preferably 18% or more, and most preferably 20% or more. If the nanofiber sheet has in-plane anisotropy, average values in two directions preferably satisfy the above-mentioned physical characteristics.

In a nanofiber sheet having a high coefficient of linear thermal expansion, the thermal expansion of a composite including the nanofiber sheet is not sufficiently decreased. The lower limit of the coefficient of linear thermal expansion of the nanofiber sheet is not particularly limited, but is usually 1 ppm/K or more. A nanofiber sheet with a coefficient of linear thermal expansion lower than this level may be applied with unnecessary warpage.

In the case that a nanofiber sheet with a low Young's modulus is applied to a transparent composite, satisfactory coefficient of thermal expansion, elastic modulus, and thermal conductivity cannot be obtained. The upper limit of the Young's modulus of the nanofiber sheet is not particularly limited, but is usually 15 GPa or less.

A nanofiber sheet with a larger fiber occupancy cannot be impregnated with a sufficient amount of a matrix material. A smaller fiber occupancy leads to a shortage in the amount of nanofiber in a composite material. Thus, both cases cannot provide a fiber-reinforced composite material with improved characteristics. In the former case, the hygroscopicity of the fiber-reinforced composite material may be increased due to the hygroscopicity of cellulose.

A nanofiber sheet with a small parallel light transmittance cannot provide a composite material with a high transparency. The upper limit of the parallel light transmittance of the nanofiber sheet is not particularly limited, but is usually 70% or less. The parallel light transmittance measured in the present invention is the absolute transmittance and therefore inevitably includes Fresnel reflection. Accordingly, if the measured value of the parallel light transmittance exceeds 90%, the measurement may be inappropriate.

[Physical Characteristics of TCDDMA(60)/NF(40) Composite Material]

The TCDDMA(60)/NF(40) composite material according to the present invention satisfies the following physical characteristics:

(1) a parallel light transmittance of light of a wavelength of 600 nm at a sheet thickness of 100 μm is 70% or more and preferably 80% or more;

(2) Young's modulus is 5.0 GPa or more and preferably 7 GPa or more; and (3) a coefficient of linear thermal expansion is 20 ppm/K or less and preferably 15 ppm/K or less.

A TCDDMA(60)/NF(40) composite material having a low parallel light transmittance at a thickness of 100 μm cannot provide a fiber-reinforced composite material with high transparency and therefore is difficult to be applied to the use where transparency is required. The upper limit of the parallel light transmittance is not particularly limited, but is usually 90% or less. The parallel light transmittance measured in the present invention is the absolute transmittance and therefore inevitably includes Fresnel reflection. Accordingly, if the measured value of the parallel light transmittance exceeds 90%, the measurement may be inappropriate.

A TCDDMA(60)/NF(40) composite material having a low Young's modulus cannot provide a fiber-reinforced composite material with a high elastic modulus. The upper limit of the Young's modulus of the TCDDMA(60)/NF(40) composite material is not particularly limited, but is usually 20 GPa or less.

A TCDDMA(60)/NF(40) composite material having a high coefficient of linear thermal expansion cannot provide a fiber-reinforced composite material with low thermal expansion. The lower limit of the coefficient of linear thermal expansion of the TCDDMA(60)/NF(40) composite material is not particularly limited, but is usually 3 ppm/K or more.

[Nanofiber Raw Material]

The nanofiber of the nanofiber sheet of the present invention is preferably obtained from wood flour.

That is, as described above, bacteria cellulose has problems such that it is expensive and difficult to provide a uniform sheet without waves and warps and has high birefringence.

Cotton does not contain lignin and hemicellulose and is therefore low in mechanical fibrillation effect. For example, in fibrillation with a grinder, cotton has a disadvantage that the period of time for the fibrillation of cotton is 10 or more times longer than that of wood flour, which causes breakage of crystalline cellulose, resulting in a decrease in the crystallinity.

In addition, pulp is dried and, therefore, is also low in mechanical fibrillation efficiency. The amount of water in pulp is usually about 10 wt % at ambient temperature.

On the other hand, wood flour can be fibrillated to a nanoscale as described below by the removal of lignin and hemicellulose by suitable treatment and mechanical fibrillation without drying, while retaining high crystallinity without requiring excess fibrillation such that crystalline cellulose is broken. Furthermore, wood flour does not have branching of fiber, unlike bacterial cellulose, and therefore can provide a uniform sheet without waves and warps and low in the birefringence.

Preferred wood flour used as a raw material is, for example, a wood powder or a bamboo powder. In particular, those having a major axis of 2 mm or less and 30 μm or more are preferred. A larger major axis of the wood flour may lead to insufficient fibrillation in the subsequent mechanical fibrillation step. A smaller major axis of the wood flour may cause breakage of cellulose crystals during grinding and lead to insufficient crystallinity. Consequently, desired effects may not be achieved.

The upper limit of the major axis of wood flour is preferably 2 mm or less, more preferably 1 mm or less, and most preferably 500 μm or less. The lower limit of the major axis of the wood flour is preferably 30 μm or more, more preferably 50 μm or more, and most preferably 100 μm or more.

Wood flour with a larger ratio of the major axis to the minor axis is not readily ground with a grinder.

Accordingly, the ratio of (major axis)/(minor axis) is preferably is 40 or less, more preferably 20 or less, and most preferably 10 or less. This ratio is usually 1 or more.

The wood flour as a raw material of nanofiber preferably contains 3 wt % or more of water. When the amount of water of the wood flour is less than 3 wt %, the cellulose fiber molecules are close to each other in distance and hydrogen bonds develop between the cellulose fiber molecules to cause a decrease in mechanical fibrillation effect, resulting in insufficient fibrillation. When the amount of water of the wood flour is higher than 70 wt %, the wood flour is softened, resulting in difficulties in handling and transport.

Preferred examples of the wood flour include a bamboo powder, wood flour of coniferous trees, and wood flour of broadleaved trees. The wood flour of broadleaved trees is advantageously easy to remove lignin.

Wood flour that satisfies the above-described suitable physical characteristics can be obtained from, for example, broadleaved trees, coniferous trees, bamboo, kenaf, or palm tree. Among them, the wood flour is preferably obtained from trunks and branches of broadleaved trees and coniferous trees.

[Method of Producing Nanofiber Sheet]

The method of producing a nanofiber sheet of the present invention is a method for producing the nanofiber sheet of the present invention described above and includes a fibrillation step of obtaining nanofiber by mechanically fibrillating a nanofiber precursor, which is preferably wood flour. Specifically, the method is carried out by the procedures below. In all steps before the mechanical fibrillation step (f), the nanofiber precursor contains 3 wt % or more of water. That is, it is characterized that 3 wt % or more of water must be contained. The amount of water of the nanofiber precursor is preferably 4 wt % or more and more preferably 5 wt % or more. If the nanofiber precursor containing a lower amount of water is treated, the cellulose fiber molecules are close to each other in distance and hydrogen bonds develop between the cellulose fiber molecules to cause a decrease in mechanical fibrillation effect, resulting in insufficient fibrillation. The method includes:

(a) a degreasing step,
(b) a lignin-removing step,
(c) a washing step,
(d) a hemicellulose-removing step,
(e) a water washing step,
(f) a mechanical fibrillation step, and
(g) a papermaking step.

In addition, after the papermaking step, (h) a chemical modification step may be carried out for chemically modifying the hydroxyl groups of the nanofiber.

As described above, wood flour is preferably used as a raw material.

The method of producing the nanofiber sheet of the present invention will now be described according to the procedures.

In the below, an example using wood flour as a raw material, that is, producing a nanofiber sheet as a nanofiber precursor will be described. However, in the method of producing the nanofiber sheet of the present invention, a raw material other than wood flour can be used, as long as the nanofiber sheet produced by fibrillation satisfies the above-mentioned physical characteristics as the present invention.

[Degreasing Step]

The degreasing step is preferably extraction with an organic solvent. The organic solvent is preferably an ethanol/benzene mixture, which has an advantage of high elution ability and is therefore desirable.

In the degreasing treatment using the ethanol/benzene mixture, first, wood flour is put in an extraction thimble, and ethanol/benzene mixture (ethanol:benzene=1:2 v/v) is put in a Soxhlet extractor flask. The extractor is assembled, and extraction is carried out in a hot-water bath for six hours. In this operation, heating is carried out such that the solvent boils weakly and is refluxed through a siphon tube once every about 10 minutes. After the extraction, the solvent is collected by distillation on a hot-water bath, and the sample is air-dried.

This step is performed for removing oil-soluble impurities contained in, for example, wood flour in several percents or less. Insufficient removal of the oil-soluble impurities may cause problems such as a change in color due to high-temperature treatment, deterioration with age, an insufficient decrease in thermal expansion, and a decrease in elastic modulus.

[Lignin-Removing Step]

The lignin-removing step is preferably a step for immersing the wood flour in an oxidizer, and particularly preferred oxidizer is a sodium chlorite aqueous solution.

Such a lignin-removing treatment is preferably carried out by a Wise method using sodium chlorite and acetic acid. The Wise method is simple in procedure and can be applied to a large amount of wood flour and is therefore advantageous.

The removal of lignin by the Wise method is carried out by putting one gram of degreased wood flour in a solution of 60 mL of distilled water, 0.4 g of sodium chlorite, and 0.08 mL of glacial acetic acid and heating the mixture in a hot-water bath of 70 to 80° C. for one hour with occasional stirring. After one hour, without cooling, 0.4 g of sodium chlorite and 0.08 mL of glacial acetic acid are further added to the mixture, and the procedure is repeated. This procedure is repeated four times in total in the case of a coniferous tree and is repeated three times in total in the case of a broadleaved tree.

The above-mentioned concentration or amount of each reagent, treatment concentration, and treatment time are only one example, and the present invention is not limited thereto.

Lignin can be removed by another method, for example, by a multistep process, which is employed in a pulp-producing process, involving chlorine treatment and alkaline extraction or a bleaching process with chlorine dioxide or oxygen in the presence of an alkali. However, chlorine treatment causes a decrease in the degree of polymerization of cellulose and is, therefore, desired to be avoided.

The conditions for lignin-removing treatment are suitably adjusted to give a nanofiber sheet containing lignin in the above-mentioned amount.

[Washing Step]

After the lignin-removing step, the wood flour is washed with cold water (about 500 mL) and then acetone (about 50 mL, ethanol or methanol can be used instead of acetone). By this washing, water, remaining agents, and residues are removed.

[Hemicellulose-Removing Step]

The hemicellulose-removing step is preferably a step for immersing the wood flour in an alkali, and particularly preferred alkali is a potassium hydroxide aqueous solution.

A stronger alkali for removing hemicellulose dissolves or deteriorates the crystals of cellulose, and weaker alkali cannot sufficiently remove hemicellulose. Therefore, in the case using a potassium hydroxide aqueous solution, the concentration is preferably 3 to 10 wt % and particularly preferably 5 to 8 wt %.

A sodium hydroxide aqueous solution can be also used at a low concentration, but, cellulose crystals are readily deteriorated by sodium hydroxide compared to that in the use of potassium hydroxide. Accordingly, a potassium hydroxide aqueous solution is preferred.

The immersing time varies depending on the concentration of an alkali. For example, in 5 wt % potassium hydroxide aqueous solution, hemicellulose can be removed by immersing wood flour in the solution overnight at room temperature.

The conditions for hemicellulose-removing treatment are suitably adjusted to give a nanofiber sheet containing hemicellulose in the above-mentioned amount.

[Washing Step]

In the washing step after the hemicellulose-removing step, for example, the wood flour immersed in an alkali is collected by suction filtration and is washed with water under suction. The amount of water used in this washing step is that sufficient for neutralizing the wood flour, for example, two liters or more on the basis of 10 g of wood flour.

[Mechanical Fibrillation Step]

In the mechanical fibrillation step, a nanofiber precursor solution or dispersion preferably contains 0.1 to 5 wt % of solid content and more preferably 0.1 to 3 wt %. A larger amount of solid content decreases the fluidity before or during the fibrillation, resulting in insufficient fibrillation. A smaller amount of solid content is low in fibrillation efficiency, which is industrially inadequate.

The mechanical fibrillation is preferably carried out with a grinder or a combination of a grinder and another device.

The grinder is a stone pulverizer for grinding a raw material into ultrafine particles by impact, centrifugal force, and shear force that are generated when the raw material passes through a clearance between two grinders (grind stones), and can perform shear, grain refinement, dispersion, emulsification, and fibrillation at the same time. In addition to the grinder, for example, a homogenizer or a refiner can be used, but uniform fibrillation to a nano-scale only with the refiner or the homogenizer is difficult. In general, the fibrillation treatment is preferably carried out only with a grinder or carried out with a grinder and then a refiner or a homogenizer.

The mechanical fibrillation with a grinder is carried out using plate-like grind stones facing to each other under the following conditions:

Clearance between the grind stones: 1 mm or less, preferably 0.5 mm or less, more preferably 0.1 mm or less, and most preferably 0.05 mm or less and 0.001 mm or more, preferably 0.005 mm or more, more preferably 0.01 mm or more, and most preferably 0.03 mm or more;

Diameter of the grind stones: 10 cm or more and 100 cm or less and preferably 50 cm or less;

Revolution number of the grind stones: 500 rpm or more, preferably 1000 rpm or more, and most preferably 1500 rpm or more and 5000 rpm or less, preferably 3000 rpm or less, and most preferably 2000 rpm or less;

Detention time of wood flour between the grind stones: 1 to 30 minutes, more preferably 5 to 20 minutes, and most preferably 10 to 15 minutes;

Treatment temperature: 30 to 90° C., preferably 40 to 80° C., and more preferably 50 to 70° C.

A clearance between the grind stones smaller than the above value, a diameter larger than the above value, a revolution number higher than the above value, or a detention time longer than the above value decreases the crystallinity of cellulose. Consequently, undesirably, the resulting nanofiber sheet is not imparted with satisfactory characteristics, such as a high elastic modulus and a low thermal expansion.

A clearance between the grind stones larger than the above value, a diameter smaller than the above value, a revolution number lower than the above value, or a detention time shorter than the above value cannot achieve sufficient fibrillation into a nano-scale.

In addition, a fibrillation treatment temperature higher than the above value may cause boiling of the wood flour, resulting in a decrease in fibrillation efficiency, or may deteriorate crystalline cellulose. In a temperature lower than the above value, the fibrillation efficiency is low.

[Papermaking Step]

After the mechanical fibrillation, the resulting water-containing fiber is subjected to papermaking to remove water, which gives a nanofiber sheet.

The method for removing water is not particularly limited. For example, a large amount of water is first removed by ventilation or cold press and then the remaining water is completely removed by further ventilation or hot press. Alternatively, after cold press, water is almost completely removed in a drier or by natural drying.

The ventilation for removing a large amount of water is a method where water is gradually emitted over time.

The cold press is a method for extracting water only by pressurizing without heating and can squeeze out a large amount of water. The pressure in the cold press is preferably 0.01 to 10 MPa and more preferably 0.1 to 3 MPa. A pressure lower than 0.01 MPa tends to increase the residual amount of water, and a pressure higher than 10 MPa may break the nanofiber sheet. The temperature is not particularly limited, but is preferably at ambient temperature, as a matter of practical convenience.

The ventilation for almost completely removing the remaining water is a method for drying nanofiber over a long time.

The hot press is a method for extracting water by pressurizing with heating and can almost completely remove the remaining water. The pressure in the hot press is preferably 0.01 to 10 MPa and more preferably 0.2 to 3 MPa. In a pressure lower than 0.01 MPa, water may not be removed. A pressure higher than 10 MPa may break the resulting nanofiber. The temperature is not particularly limited, but is preferably 100 to 300° C. and more preferably 110 to 200° C. If the temperature is lower than 100° C., the removal of water takes a long period of time. On the other hand, the temperature is higher than 300° C., cellulose fiber may be decomposed.

The drying temperature in the drier is preferably 100 to 300° C. and more preferably 110 to 200° C. If the drying temperature is lower than 100° C., water may not be removed. On the other hand, the temperature is higher than 300° C., cellulose fiber may be decomposed.

In order to decrease the coefficient of thermal expansion of a transparent resin composite sheet, hot press is preferred because the hydrogen bond at the tangling portion of fiber is further strengthened.

[Chemical Modification Step]

The step of chemically modifying the hydroxyl group of nanofiber of the nanofiber sheet prepared by the papermaking is preferably a step for introducing a hydrophobic functional group through one or more of ether bonds, ester bonds, and urethane bonds by chemically modifying the hydroxyl group of cellulose fiber of the nanofiber with one or more selected from the group consisting of acids, alcohols, halogenating reagents, acid anhydrides, and isocyanates.

Hereinafter, the nanofiber sheet where a part of the hydroxyl groups of nanofiber is chemically modified is referred to as "derivatized nanofiber sheet".

In the present invention, examples of the substituents introduced into the hydroxyl groups of nanofiber by chemical modification include an acetyl group, a methacryloyl group, a propanoyl group, a butanoyl group, an iso-butanoyl group, a pentanoyl group, a hexanoyl group, a heptanoyl group, an octanoyl group, a nonanoyl group, a decanoyl group, an undecanoyl group, a dodecanoyl group, a myristoyl group, a palmitoyl group, a stearoyl group, a pivaloyl group, a 2-methacryloyloxyethylisocyanoyl group, a methyl group, an ethyl group, a propyl group, an iso-propyl group, a butyl group, an iso-butyl group, a tert-butyl group, a pentyl group, a hexyl group, a heptyl group, an octyl group, a nonyl group, a decyl group, an undecyl group, a dodecyl group, a myristyl group, a palmityl group, and stearyl group. The substituents introduced to the hydroxyl groups of cellulose fiber may be one type or two or more different types of these functional groups.

Among them, preferred are ester functional groups. In particular, acyl groups such as an acetyl group and/or methacryloyl group are preferred.

In particular, introduction of the same or same type of functional group as that of an amorphous synthetic resin serving as a matrix material described below forms a covalent bond between the functional group of the nanofiber and the functional group of the resin as the matrix material to give favorable effects that decrease the hygroscopicity and increase the transparency. Thus, such introduction is preferred.

In the case that a relatively bulky functional group such as a methacryloyl group, a pivaloyl group, a long-chain alkyl group, a long-chain alkanoyl group, or a 2-methacryloyloxyethylisocyanoyl group is introduced, it is difficult to chemically modify the hydroxyl group of nanofiber only with such a bulky functional group at a high degree of substitution. Accordingly, in the case that such a bulky functional group is introduced, the degree of substitution is preferably increased by introducing a bulky functional group and then introducing a small functional group such as an acetyl group, a propanoyl group, a methyl group, or an ethyl group to residual hydroxyl groups by conducting chemical modification again.

Examples of the chemical modification agents composed of one or more selected from the group consisting of acids, alcohols, halogenating reagents, acid anhydrides, and isocyanates for introducing the functional groups include those shown in Table 1.

TABLE 1

| Functional group | Chemical modification agent |
|---|---|
| Acetyl group | acetic acid, acetic anhydride, acetyl halide |
| Methacryloyl group | methacrylic acid, methacrylic anhydride, methacryloyl halide |
| Propanoyl group | propanoic acid, propanoic anhydride, propanoyl halide |
| Butanoyl group | butanoic acid, butanoic anhydride, butanoyl halide |
| Iso-butanoyl group | iso-butanoic acid, iso-butanoic anhydride, iso-butanoyl halide |
| Pentanoyl group | pentanoic acid, pentanoic anhydride, pentanoyl halide |
| Hexanoyl group | hexanoic acid, hexanoic anhydride, hexanoyl halide |
| Heptanoyl group | heptanoic acid, heptanoic anhydride, heptanoyl halide |
| Octanoyl group | octanoic acid, octanoic anhydride, octanoyl halide |
| Nonanoyl group | nonanoic acid, nonanoic anhydride, nonanoyl halide |
| Decanoyl group | decanoic acid, decanoic anhydride, decanoyl halide |
| Undecanoyl group | undecanoic acid, undecanoic anhydride, undecanoyl halide |
| Dodecanoyl group | dodecanoic acid, dodecanoic anhydride, dodecanoyl halide |
| Myristoyl group | myristic acid, myristic anhydride, myristoyl halide |
| Palmitoyl group | palmitic acid, palmitic anhydride, palmitoyl halide |
| Stearoyl group | stearic acid, stearic anhydride, stearoyl halide |
| Pivaloyl group | pivalic acid, pivalic anhydride, pivaloyl halide |
| 2-Methacryloyl-oxyethyl-isocyanoyl group | 2-methacryloyloxyethylisocyanic acid |
| Methyl group | methyl alcohol, methyl halide |
| Ethyl group | ethyl alcohol, ethyl halide |
| Propyl group | propyl alcohol, propyl halide |
| Iso-propyl group | iso-propyl alcohol, iso-propyl halide |
| Butyl group | butyl alcohol, butyl halide |
| Tert-butyl group | tert-butyl alcohol, tert-butyl halide |
| Pentyl group | pentyl alcohol, pentyl halide |
| Hexyl group | hexyl alcohol, hexyl halide |
| Heptyl group | heptyl alcohol, heptyl halide |
| Octyl group | octyl alcohol, octyl halide |
| Nonyl group | nonyl alcohol, nonyl halide |
| Decyl group | decyl alcohol, decyl halide |
| Undecyl group | undecyl alcohol, undecyl halide |
| Dodecyl group | dodecyl alcohol, dodecyl halide |
| Myristyl group | myristyl alcohol, myristyl halide |
| Palmityl group | palmityl alcohol, palmityl halide |
| Stearyl group | stearyl alcohol, stearyl halide |

Chemical modification of nanofiber can be carried out by a usual method. For example, the nanofiber sheet is immersed in a solution containing a chemical modification agent under suitable conditions for a certain period of time.

In such a case, the reaction solution containing a chemical modification agent may be only a chemical modification agent and a catalyst or may be a solution of a chemical modification agent. Any solvent other than water, primary alcohol, and secondary alcohol can be used without particular limitation. Examples of the catalyst include basic catalysts such as pyridine, N,N-dimethylaminopyridine, triethylamine, sodium hydrogen, tert-butyllithium, lithium diisopropylamide, potassium tert-butoxide, sodium methoxide, sodium ethoxide, sodium hydroxide, and sodium acetate; and acid catalysts such as acetic acid, sulfuric acid, and perchloric acid. The basic catalysts such as pyridine are preferred because of their high reaction rates and effects for preventing a decrease in the degree of polymerization. Sodium acetate is free from a problem of coloring of nanofiber sheets, due to chemical modification, and can increase the degree of substitution by raising reaction temperature, and is preferred in these points. Perchloric acid and sulfuric acid are free from a problem of coloring of nanofiber sheets, due to chemical modification, and can increase the degree of substitution under reaction conditions, i.e., at room temperature, a short period of time, and a small amount of a chemical modification agent, and are preferred in these points. In the case that a solution of a chemical modification agent is used as a reaction solution, the amount of the chemical modification agent in the reaction solution is preferably 1 to 75 wt %, and, more preferably, the amount is 25 to 75 wt % in the presence of a basic catalyst or 1 to 20 wt % in the presence of an acid catalyst.

A higher temperature for the chemical modification may change the cellulose fiber into yellow or may cause a decrease in the degree of polymerization, and a lower temperature leads to a reduction in the reaction rate. Consequently, the temperature is appropriately about 40 to 100° C. under basic conditions and 10 to 40° C. under acidic conditions. Furthermore, in this chemical modification, the contact efficiency between the nanofiber and the chemical modification agent may be increased by injecting the reaction solution into the inside of a nanofiber sheet so as to sufficiently spread in every detail and leaving the nanofiber sheet standing under a reduced pressure of about 1 kPa for about one hour. The reaction time is suitably determined according to the reaction solution and the reaction rate under such treatment conditions, and is usually about 24 to 336 hours under basic conditions and about 0.5 to 12 hours under acidic conditions.

The nanofiber sheet prepared by the mechanical fibrillation and the papermaking may allow less impregnation of the reaction solution containing the chemical modification agent because of the crossover and contact structure of the fiber, resulting in a low reaction rate of chemical modification, in some cases.

Accordingly, in the present invention, the reaction rate of the chemical modification is preferably increased by increasing the contact efficiency between a nanofiber sheet and a reaction solution in the papermaking step by subjecting the nanofiber sheet containing water before the water-removing treatment only to cold press, according to need, for partially removing the water so that the nanofiber sheet still contains a small amount of water (first step), substituting the water in the water-containing nanofiber sheet with an appropriate organic solvent (first organic solvent) (second step), and bringing the nanofiber sheet containing the organic solvent into contact with a reaction solution for efficiently impregnating the water-containing nanofiber sheet with the reaction solution (third step).

The first organic solvent is preferably a solvent that can be evenly mixed with both water and a reaction solution containing a chemical modification agent and has a boiling point lower than those of water and the reaction solution for smoothly conducting substitution of water in the water-containing nanofiber sheet by the first organic solvent and then with the reaction solution containing the chemical modification agent. Such solvents are preferably water-soluble organic solvents, and preferred examples of the solvents include alcohols such as methanol, ethanol, propanol, and isopropanol; ketones such as acetone; ethers such as tetrahydrofuran and 1,4-dioxane; amides such as N,N-dimethylacetamide and N,N-dimethylformamide; carboxylic acids such as acetic acid; nitrites such as acetonitrile; and aromatic heterocyclic compounds such as pyridine. For example, ethanol and acetone are preferred from the viewpoints of the ease of availability and workability. The organic solvents may be used alone or as a mixture of two or more thereof.

The method of substituting water in the water-containing nanofiber sheet by the first organic solvent is not particularly limited. For example, water in the water-containing nanofiber sheet is substituted by the first organic solvent by immersing the water-containing nanofiber sheet in the first organic solvent for a predetermined period of time to leach out the water from the water-containing nanofiber sheet into the first organic solvent and properly exchanging the first organic solvent containing the leached water for flesh first organic solvent. The temperature for the immersion/substitution is preferably about 0 to 60° C. in order to prevent the first organic solvent from sublimation, and is usually room temperature.

The removal of part of the water contained in the nanofiber sheet by cold press prior to the substitution of water in the water-containing nanofiber sheet with the first organic solvent is preferable for efficiently substituting the water by the first organic solvent.

The degree of the cold press is designed such that the resulting fiber-reinforced composite material contains a target amount of fiber by both the cold press and the press performed prior to the impregnation of a derivatized nanofiber sheet in a liquid for impregnation. In general, the thickness of the water-containing nanofiber sheet after the press is preferably about from one-half to one twentieth of that before the press. The pressure and the detention time for the cold press are suitably determined according to the degree of the press within the range of 0.01 to 100 MPa (in the case of a press of 10 MPa or more, the press rate is lowered not to break the nanofiber sheet), and in the range of 0.1 to 30 minutes. The press temperature is preferably about 0 to 60° C. with the same reasons as those in the temperature conditions for the substitution of water by an organic solvent, and is usually room temperature. The water-containing nanofiber sheet having the reduced thickness after the press treatment maintains substantially the same thickness even after the substitution of water by the first organic solvent. However, the press treatment is not indispensable. That is, the water-containing nanofiber sheet may be directly immersed in the first organic solvent for substitution of water by the first organic solvent.

After the substitution of water in the nanofiber sheet by the first organic solvent, the nanofiber sheet containing the organic solvent is immersed in a reaction solution for chemical modification. The treatment conditions for this step are the same as those for chemical modification of the nanofiber sheet after the removal of the water, but, because of an increase in the reaction rate, the treatment time is about 12 to 118 hours under basic conditions and about 0.3 to 3 hours under acidic conditions.

This chemical modification is carried out to a degree such that the hydroxyl groups of the nanofiber are chemically modified at the above-mentioned degree of the substitution.

[Fiber-Reinforced Composite Material]

The fiber-reinforced composite material of the present invention is composed of such a nanofiber sheet of the present invention impregnated with a matrix material.

[Matrix Material]

The matrix material of the fiber-reinforced composite material of the present invention is a base material of the fiber-reinforced composite material of the present invention and may be any material that can produce a fiber-reinforced composite material satisfying the suitable physical characteristics described below without particularly limitation. Examples of the matrix material include organic polymers, inorganic polymers, and hybrid polymers of organic polymers and inorganic polymers. These matrix materials may be used alone or as a mixture of two or more thereof.

Preferred examples of the matrix materials of the present invention will be described below, but the matrix materials used in the present invention are not limited thereto.

Examples of the inorganic polymer matrix materials include ceramics such as glass, silicate materials, and titanate materials. These polymers can be formed by a dehydration-condensation reaction of alcoholate. The organic polymers include natural polymers and synthetic polymers.

Examples of the natural polymers include regenerated cellulose polymers, such as cellophane and triacetyl cellulose.

Examples of the synthetic polymers include vinyl resins, polycondensation resins, polyaddition resins, addition-condensation resins, and ring-opening polymerization resins.

Examples of the vinyl resins include common resins such as polyolefins, vinyl chloride resins, vinyl acetate resins, fluororesins, and (meth)acrylic resins; and engineering plastics and super engineering plastics that are prepared by vinyl polymerization. These resins may be homopolymers or copolymers of monomers.

Examples of the polyolefins include homopolymers and copolymers of ethylene, propylene, styrene, butadiene, butene, isoprene, chloroprene, isobutylene, and isoprene; and cyclic polyolefins having a norbornene backbone.

Examples of the vinyl chloride resins include homopolymers and copolymers of vinyl chloride and vinylidene chloride.

Examples of the vinyl acetate resins include polyvinyl acetates, which are homopolymers of vinyl acetate; polyvinyl alcohols, which are products of hydrolysis of polyvinyl acetate; polyvinyl acetals, which are produced by a reaction of vinyl acetate with formaldehyde or n-butylaldehyde; and polyvinyl butyrals, which are produced by a reaction of, for example, polyvinyl alcohol or butylaldehyde.

Examples of the fluororesins include homopolymers and copolymers of, for example, tetrachloroethylene, hexafluoropropylene, chlorotrifluoroethylene, vinylidene fluoride, vinyl fluoride, and perfluoroalkylvinyl ether.

Examples of the (meth)acrylic resins include homopolymers and copolymers of, for example, (meth)acrylic acid, (meth)acrylonitrile, (meth)acrylic acid esters, and (meth)acrylamides. In this description, the term "(meth)acryl" means "acryl and/or methacryl". (Meth)acrylic acid herein includes acrylic acid and methacrylic acid, and (meth)acrylonitrile includes acrylonitrile and methacrylonitrile. Examples of the (meth)acrylic acid esters include alkyl(meth)acrylates, (meth)acrylic acid monomers having cycloalkyl groups, and alkoxyalkyl(meth)acrylates. Examples of the alkyl(meth)acrylates include methyl (meth)acrylate, ethyl (meth)acrylate, butyl (meth)acrylate, 2-ethylhexyl(meth)acrylate, cyclohexyl(meth)acrylate, benzyl (meth)acrylate, lauryl(meth)acrylate, stearyl(meth)acrylate, and hydroxyethyl (meth)acrylate. Examples of the (meth)acrylic acid monomers having cycloalkyl groups include cyclohexyl (meth)acrylate and isobornyl(meth)acrylate. Examples of the alkoxyalkyl(meth)acrylates include 2-methoxyethyl (meth)acrylate, 2-ethoxyethyl (meth)acrylate, and 2-butoxyethyl (meth)acrylate. Examples of the (meth)acrylamides include (meth)acrylamide and N-substituted (meth)acrylamides such as N-methyl(meth)acrylamide, N-ethyl(meth)acrylamide, N,N-dimethyl(meth)acrylamide, N,N-diethyl(meth)acrylamide, N-isopropyl(meth)acrylamide, and N-t-octyl(meth)acrylamide. The number of the polymerizable functional groups in the monomers of (meth)acrylic resins is not particularly limited, but, preferred are those having one or two functional groups or a mixture thereof, from the viewpoints of toughness and heat resistance.

Examples of the polycondensation resins include amide resins and polycarbonates.

Examples of the amide resins include aliphatic amide resins such as 6,6-nylon, 6-nylon, 11-nylon, 12-nylon, 4,6-nylon, 6,10-nylon, and 6,12-nylon; aromatic polyamides composed of aromatic diamines such as phenylene diamine and aromatic dicarboxylic acids, such as terephthaloyl chloride and isophthaloyl chloride, or derivatives thereof.

The polycarbonates are reaction products of bisphenol A or bisphenols, which are derivatives of bisphenol A, and phosgene or phenyl dicarbonate.

Examples of the polyaddition resins include ester resins, U-polymers, liquid-crystal polymers, polyetherketones, polyetheretherketones, unsaturated polyesters, alkyd resins, polyimide resins, polysulfones, polyphenylene sulfides, and polyethersulfones.

Examples of the ester resins include aromatic polyesters, aliphatic polyesters, and unsaturated polyesters. Examples of the aromatic polyesters include copolymers of diols described below, such as ethylene glycol, propylene glycol, and 1,4-butanediol, and aromatic dicarboxylic acid such as terephthalic acid. Examples of the aliphatic polyesters include copolymers of diols described below and aliphatic dicarboxylic acid such as succinic acid and valeric acid; homopolymers and copolymers of hydroxycarboxylic acid such as glycolic acid and lactic acid; and copolymers of the above-mentioned diols, aliphatic dicarboxylic acid, and hydroxycarboxylic acid. Examples of the unsaturated polyesters include copolymers of unsaturated dicarboxylic acid such as diols described below and maleic acid anhydride, and vinyl monomers such as styrene according to need.

Examples of the U-polymers include copolymers of bisphenol A or bisphenols, which are derivatives of bisphenol A, terephthalic acid, and isophthalic acid.

Examples of the crystal-liquid polymers include copolymers of p-hydroxybenzoic acid with, for example, terephthalic acid, p,p'-dioxydiphenol, p-hydroxy-6-naphtoic acid, or ehthylene polyterephthalic acid.

Examples of the polyetherketones include homopolymers and copolymers of 4,4'-difluorobenzophenone and 4,4'-dihydrobenzophenone.

Examples of the polyetheretherketones include copolymers of 4,4'-difluorobenzophenone with, for example, hydroquinone.

Examples of the alkyd resins include copolymers of higher fatty acid such as stearic acid and palmitic acid, dibasic acid such as phthalic anhydride, and polyol such as glycerin.

Examples of the polystyrene include copolymers of 4,4'-dichlorodiphenylsulfone and bisphenol A.

Examples of the polyphenylene sulfides include copolymers of p-dichlorobenzene and sodium sulfide.

Examples of the polyethersulfones include polymers of 4-chloro-4'-hydroxydiphenylsulfone.

Examples of the polyimide resins include pyromellitic acid-based polyimides, which are copolymers of, for example, polymellitic anhydride and 4,4'-diaminodiphenylether; trimellitic acid-based polyimide, which are copolymers of, for example, aromatic diamines such as trimellitic acid chloride anhydride and p-phenylene diamine, and diisocyanate compounds described below; biphenyl polyimides of, for example, biphenyltetracarboxylic acid, 4,4'-diaminodiphenylether, and p-phenylenediamine; benzophenone polyimides of, for example, benzophenonetetracarboxylic acid and 4,4'-diaminodiphenylether; and bismaleimide polyimides of, for example, bismaleimide and 4,4'-diaminodiphenylmethane.

Examples of the polyaddition resins include urethane resins.

The urethane resins are copolymers of diisocyanates and diols. Examples of the diisocyanates include dicyclohexylmethane diisocyanate, 1,6-hexamethylene diisocyanate, isophorone diisocyanate, 1,3-cyclohexylene diisocyanate, 1,4-cyclohexylene diisocyanate, 2,4-tolylene diisocyanate, 2,6-tolylene diisocyanate, 4,4'-diphenylmethane diisocyanate, 2,4'-diphenylmethane diisocyanate, and 2,2'-diphenylmethane diisocyanate. Examples of the diols include diols having a relatively low molecular weight, for example, ethylene glycol, propylene glycol, 1,3-propanediol, 1,3-butanediol, 1,4-butanediol, 1,5-pentanediol, 3-methyl-1,5-pentanediol, 1,6-hexanediol, neopentyl glycol, diethylene glycol, trimethylene glycol, triethylene glycol, tetraethylene glycol, dipropylene glycol, tripropylene glycol, and cyclohexane dimethanol; and polyester diols, polyether diols, and polycarbonate diols.

Examples of the addition-condensation resins include phenol resins, urea resins, and melamine resins.

Examples of the phenol resins include homopolymers and copolymers of phenol, cresol, resorcinol, phenylphenol, bisphenol A, and bisphenol F.

The urea resins and the melamine resins are copolymers of, for example, formaldehyde, urea, and melamine.

Examples of the ring-opening polymerization resins include polyalkylene oxides, polyacetals, and epoxy resins. Examples of the polyalkylene oxides include homopolymers and copolymers such as ethylene oxide and propylene oxide. Examples of the polyacetals include copolymers such as trioxane, formaldehyde, and ethylene oxide. Examples of the epoxy resins include aliphatic epoxy resins that are composed of polyols such as ethylene glycol and epichlorohydrin; and aliphatic epoxy resins that are composed of bisphenol A and epichlorohydrin.

In the present invention, among the above-described matrix materials, amorphous synthetic polymers having high glass transition temperature (Tg) are preferred for preparing fiber-reinforced composite materials with high transparency and excellent durability. The degree of amorphousness is preferably 10% or less as crystallinity and more preferably 5% or less. A degree of crystallinity higher than this range may cause problems in transparency and evenness. The Tg is preferably 110° C. or higher, more preferably 120° C. or higher, and most preferably 130° C. or higher. A matrix material with a Tg lower than 110° C. may cause a problem in durability when applied to transparent parts or optical parts, for example, deformation occurs when the parts are brought into contact with boiling water.

In the present invention, preferred examples of the transparent matrix resins include thermosetting resins such as acrylic resins, methacrylic resins, epoxy resins, urethane resins, phenol resins, melamine resins, novolac resins, urea resins, guanamine resins, alkyd resins, unsaturated polyester resins, vinylester resins, diallyl phthalate resins, silicone resins, furan resins, ketone resins, xylene resins, thermosetting polyimides, styrylpyridine resins, and triazine resins. Among them, acrylic resins and methacrylic resins have high transparency and are therefore preferred.

These matrix materials may be used alone or as a mixture of two or more thereof.

[Preferred Matrix Material]

Among the above-mentioned matrix materials, examples that are particularly preferable for the present invention are:
(i) light-curing resins and thermosetting resins, such as acrylic resins, methacrylic resins, and epoxy resins, that are transparent and amorphous and have high glass transition temperature after curing, for example, 100° C. or higher, preferably 120° C. or higher, more preferably 150° C. or higher, and most preferably 200° C. or higher;
(ii) thermoplastic synthetic resins, such as polycarbonates, polyethersulfones, polysulfones, amorphous polyolefins, polyetherimides, and acrylics, that are transparent and amorphous and have high glass transition temperature, for example, 100° C. or higher, preferably 120° C. or higher, more preferably 150° C. or higher, and most preferably 200° C. or higher;
(iii) transparent inorganic resin materials, such as silicate and titanate, for forming films by a sol-gel method; and
(iv) compositions (hybrid resin materials) of the curing resins, thermoplastic resins, and inorganic resin materials.

In particular, preferred are amorphous synthetic resins showing the following characteristics:
parallel light transmittance at a thickness of 100 μm: 60% or more, preferably 70% or more, and more preferably 80% or more;
coefficient of linear thermal expansion: 20 to 140 ppm/K, preferably 40 to 120 ppm/K, and more preferably 50 to 100 ppm/K;
crystallinity: 5% or less;
glass transition temperature (Tg): 120° C. or higher, preferably 150° C. or higher, and more preferably 200° C. or higher; and
Young's modulus: 0.5 to 6 GPa, preferably 1 to 5 GPa, and more preferably 2 to 5 GPa.

Furthermore, it is preferable that the Young's modulus is lower than that of nanofiber or the coefficient of linear thermal expansion is higher than that of nanofiber. This achieves a high Young's modulus and a low coefficient of linear thermal expansion when the matrix material is formed into a fiber-reinforced composite material with a nanofiber sheet.

An amorphous synthetic resin having a low parallel light transmittance cannot provide a fiber/resin composite material with high transparency. The upper limit of the parallel light transmittance of an amorphous synthetic resin at 100 μm thickness is not particularly limited, but is usually 90% or less. The parallel light transmittance measured in the present invention is the absolute transmittance and therefore inevitably includes Fresnel reflection. Accordingly, if the measured value of the parallel light transmittance exceeds 90%, the measurement may be inappropriate.

In an amorphous synthetic resin with a low coefficient of linear thermal expansion, for example, the crosslink density may be forcedly increased, which causes fragility, and, as a result, the physical characteristics of the resin may be deteriorated. An amorphous synthetic resin with a high coefficient of linear thermal expansion cannot provide a fiber/resin composite material with a sufficiently low thermal expansion.

An amorphous synthetic resin having high crystallinity cannot have sufficient transparency as an amorphous synthetic resin.

In an amorphous synthetic resin having a low glass transition temperature (Tg), the resulting fiber/resin composite material has insufficient heat resistance. In particular, from the viewpoint of forming a transparent electrode having a sufficient electroconductivity, the glass transition temperature (Tg) required is 120° C. or higher, preferably 150° C. or higher, and most preferably 200° C. or higher. The upper limit of the glass transition temperature (Tg) of the amorphous synthetic resin is not particularly limited, but is usually 250° C. or lower.

An amorphous synthetic resin having a higher Young's modulus causes problems in the characteristics of the resulting flexible sheet, due to the fragility and high anisotropy. A lower Young's modulus leads to a lack in the composite effect as a resin.

The Young's modulus of an amorphous synthetic resin is, for example, usually about 0.1 to 2 GPa in UV-curing acrylic resins and epoxy resins, about 0.5 to 1.5 GPa in thermoplastic acrylic resins, about 0.5 GPa in polycarbonate resins and polyethersulfone resins, and about 1 GPa in cyclic polyolefin resins.

The coefficient of linear thermal expansion is, for example, usually about 30 to 70 ppm/K in UV-curing acrylic resins and epoxy resins and about 50 to 80 ppm/K in thermoplastic acrylic resins, polycarbonate resins, polyethersulfone resins, and cyclic polyolefin resins.

[Fiber Content]

The amount of fiber (nanofiber) of the fiber-reinforced composite material of the present invention is preferably from 5 to 60 wt %, more preferably from 10 to 50 wt %, and most preferably from 20 to 40 wt %.

When the amount of the fiber contained in the fiber-reinforced composite material is smaller than the range, the effects caused by using the nanofiber, for example, improvement in the elastic modulus, coefficient of linear thermal expansion, and strength cannot be sufficiently achieved. An amount larger than the range decreases the relative amount of the matrix material, which leads to insufficient adhesion of the nanofiber or filling gaps in the nanofiber with the matrix material, resulting in a decrease in the strength, transparency, and unevenness of the surface. Furthermore, it is undesirable from the viewpoints of, for example, hygroscopicity and manufacturing cost.

The preferred physical characteristics of the fiber-reinforced composite material of the present invention are the same as those of the above-described TCDDMA(60)/NF(40) composite material.

[Production of Fiber-Reinforced Composite Material]

The fiber-reinforced composite material of the present invention is produced by impregnating the nanofiber sheet or the derivatized nanofiber sheet with a liquid material for impregnation that can form a matrix material such as the amorphous synthetic resin and then curing the liquid material for impregnation.

The liquid material for impregnation herein may be one or more selected from the group consisting of fluid matrix materials, raw materials for fluid matrix materials, fluid substances of fluidized matrix materials, fluid substances of fluidized raw materials of matrix materials, solutions of matrix materials, and solutions of raw materials of matrix materials.

The fluid matrix materials are those where the fluid materials themselves are fluid. Examples of the raw materials of the fluid matrix materials include polymerization intermediates such as prepolymers and oligomers.

Examples of the fluid substances of fluidized matrix materials include thermoplastic matrix materials in the melted states by heating.

Examples of the fluid substances of fluidized raw materials of matrix materials include polymerization intermediates such as prepolymers and oligomers in the melted states by heating when the polymerization intermediates are solid.

Examples of the solutions of matrix materials and the solutions of raw materials of matrix materials include solutions dissolving or slurry dispersing the matrix materials or the raw materials of matrix materials in solvents or the like. The solvent is selected so as to be suitable for dissolving the matrix material or the raw material of a matrix material. In the case that the solvent is removed by evaporation in the post-process, preferred solvents are those having low boiling points not to decompose the matrix materials and the raw materials of matrix materials. Examples of the solvents include alcohols such as ethanol, methanol, and isopropyl alcohol; ketones such as acetone; ethers such as tetrahydrofuran; mixtures thereof; mixtures thereof containing water; and polymerizable and crosslinkable acrylic monomers.

Such a liquid material for impregnation is applied to a single layer of a nanofiber sheet or a laminate of a plurality of nanofiber sheets such that the nanofiber is sufficiently impregnated with the liquid material for impregnation. Preferably, this impregnation step is partially or totally carried out under a changed pressure. The changed pressure is, for example, reduced pressure or a pressurized state. The reduced pressure or pressurized state allows the air trapped within the gaps in nanofiber to be readily substituted by the liquid material for impregnation, which prevents the air bubbles from remaining.

The reduced pressure is preferably from 0.133 kPa (1 mmHg) to 93.3 kPa (700 mmHg). A pressure higher than 93.3 kPa (700 mmHg) cannot sufficiently remove the air, resulting in remaining air in the nanofiber. On the other hand, the pressure may be lower than 0.133 kPa (1 mmHg), but it requires large-scale facilities for reducing pressure.

The treatment temperature of the impregnation step under reduced pressure is preferably 0° C. or higher and more preferably 10° C. or higher. A treatment temperature that is lower than 0° C. cannot sufficiently remove the air, resulting in remaining air in the nanofiber. The upper limit of the temperature is preferably the boiling point (that under the reduced pressure) when the solvent is used as the liquid material for impregnation. A temperature higher than this boiling point accelerates volatilization of the solvent, which tends to readily cause air bubbles.

The pressurized state is preferably 1.1 to 10 MPa. A pressurized state that is lower than 1.1 MPa cannot sufficiently remove the air, resulting in remaining air in the nanofiber. On the other hand, the pressurized state may be higher than 10 MPa, but it requires large-scale facilities for pressurizing.

The treatment temperature of the impregnation step under pressurized state is preferably 0 to 300° C., more preferably 10 to 200° C., and most preferably 30 to 100° C. A temperature that is lower than 0° C. cannot sufficiently remove the air, resulting in remaining air in the nanofiber. On the other hand, a temperature higher than 300° C. may cause degeneration and a change in color of the matrix material.

The liquid material for impregnation in the nanofiber sheet may be cured according to the method for the liquid material for impregnation. For example, when the liquid material for impregnation is a raw material for a fluid matrix material, the curing may be carried out by a polymerization, crosslinking, or chain-extending reaction.

When the liquid material for impregnation is a fluid substance of a matrix material fluidized by a graft reaction, the curing may be carried out by merely cooling. When the liquid material for impregnation is a fluid substance of a raw material of a matrix material fluidized by, for example, heat plasticization, the curing may be carried out by a combination of cooling and a polymerization, crosslinking, or chain-extending reaction.

When the liquid material for impregnation is a solution of a matrix material, the curing may be carried out by, for example, removing the solvent of the solution by evaporation or air drying. Furthermore, when the liquid material for impregnation is a solution of a raw material for a matrix material, the curing may be carried out by, for example, a combination of removing of the solvent of the solution and a polymerization, crosslinking, or chain-extending reaction. The evaporation of the solvent may be carried out not only under ordinary pressure but also under reduced pressure.

In addition, when a derivatized nanofiber sheet where a part of hydroxyl groups of the nanofiber of the nanofiber sheet is chemically modified is impregnated with a liquid material for impregnation, the curing may be carried out by substituting the reaction solution in the derivatized nanofiber sheet containing the reaction solution after the chemical modification by a liquid material for impregnation that can provide a matrix material and then curing the liquid material for impregnation.

The derivatized nanofiber sheet may be impregnated with a liquid material for impregnation by hot pressing the derivatized nanofiber sheet containing the reaction solution after the chemical modification into a dried derivatized nanofiber sheet and then impregnating the dried derivatized nanofiber sheet with the liquid material for impregnation.

Alternatively, a reaction solution contained in a derivatized nanofiber sheet containing the reaction solution after chemical modification is substituted (fourth step) by an organic solvent (second organic solvent), that is, the derivatized nanofiber sheet containing the reaction solution after the chemical modification is immersed in the second organic solvent to wash out the reaction solution (the second organic solvent is exchanged several times), and, then, the derivatized nanofiber sheet immersed in the second organic solvent is hot-pressed, according to need, to give a dried derivatized nanofiber sheet, followed by impregnation with the liquid material for impregnation. Alternatively, the derivatized nanofiber sheet in the second organic solvent may be cold-pressed for molding and is then impregnated with the liquid material for impregnation for substituting the second organic solvent by the liquid material for impregnation (fifth step). In this case, the derivatized nanofiber sheet can be efficiently impregnated with the liquid material for impregnation. The method for substituting a reaction solution contained in a derivatized nanofiber sheet containing the reaction solution after chemical modification by an organic solvent and then impregnating the derivatized nanofiber sheet with a liquid material for impregnation is optionally referred to as "organic solvent substitution method" hereinafter.

The second organic solvent used herein is preferably a solvent that can be evenly mixed with both the reaction solution and the liquid material for impregnation and has a low boiling point in order to efficiently substitute the reaction solution containing a chemical modification agent by the second organic solvent and further to substitute the second organic solvent by the liquid material for impregnation. Such solvents are preferably water-soluble organic solvents, and preferred examples of the solvents include alcohols such as methanol, ethanol, propanol, and isopropanol; ketones such as acetone; ethers such as tetrahydrofuran and 1,4-dioxane; amides such as N,N-dimethylacetamide and N,N-dimethylformamide; carboxylic acids such as acetic acid; nitriles such as acetonitrile; and aromatic heterocyclic compounds such as pyridine. For example, ethanol and acetone are preferred from the viewpoints of the ease of availability and workability. The organic solvents may be used alone or as a mixture of two or more thereof.

The method of substituting the reaction solution in the derivatized nanofiber sheet by the second organic solvent is not particularly limited. For example, the reaction solution in the derivatized nanofiber sheet is substituted by the second organic solvent by immersing the nanofiber sheet in the second organic solvent for a predetermined period of time to leach out the reaction solution from the nanofiber sheet into the second organic solvent and properly exchanging the second organic solvent containing the leached reaction solution for flesh second organic solvent. The treatment conditions for the immersion/substitution can be the same as those for substitution by the first organic solvent.

The degree of the cold press prior to the impregnation with the liquid material for impregnation or the hot press is properly determined according to a strength required for fixing the fiber content of a target fiber-reinforced composite material and entanglement of the nanofiber. In general, the thickness of the nanofiber sheet after the press is preferably about from one-half to one-twentieth of that before the press. The pressure and detention time for the cold press or the hot press are properly determined according to the degree of the press within the range of 0.01 to 100 MPa (in the case of press of 10 MPa or more, the press rate is lowered not to break the nanofiber sheet), and in the range of 0.1 to 30 minutes. The cold press temperature is preferably about 0 to 60° C. and is usually room temperature. The hot press temperature is preferably 100 to 300° C. and preferably 110 to 200° C. In a temperature lower than 100° C., it takes a long period of time to remove water. On the other hand, a temperature higher than 300° C. may cause decomposition of the nanofiber sheet. In order to fix the tangling of the nanofiber, hot press is preferred. The fixation of the tangling is expected to achieve a decrease in the coefficient of thermal expansion and an increase in the Young's modulus of the fiber/resin composite material. In particular, a decrease in the coefficient of thermal expansion is highly expected.

In some cases, the press treatment is carried out for controlling the amount of fiber of the fiber-reinforced composite material finally obtained. If the amount of fiber is suitably controlled in the preceding press treatment, the press treatment in this stage is not indispensable, and the derivatized nanofiber sheet containing the second organic solvent may be directly applied to the substitution by a liquid material for impregnation.

The method for substituting the second organic solvent in the derivatized nanofiber sheet by a liquid material for impregnation and the method for impregnating the dried derivatized nanofiber sheet with the liquid material for impregnation are not particularly limited, but a derivatized nanofiber sheet containing the second organic solvent or dried derivatized nanofiber sheet is preferably immersed in a liquid material for impregnation and is retained under reduced pressure. This volatilizes the second organic solvent in the derivatized nanofiber sheet and allows the liquid material for impregnation to infiltrate into the derivatized nanofiber sheet, resulting in the substitution of the second organic solvent in the derivatized nanofiber sheet by the liquid material for impregnation. Alternatively, the liquid material for impregnation infiltrates into the dried derivatized nanofiber sheet, resulting in the impregnation of the derivatized nanofiber sheet with the liquid material for impregnation.

The conditions of the reduced pressure are not particularly limited, but the reduced pressure is preferably from 0.133 kPa (1 mmHg) to 93.3 kPa (700 mmHg). A pressure higher than 93.3 kPa (700 mmHg) insufficiently remove the second organic solvent or insufficiently allows the liquid material for impregnation to infiltrate, resulting in remaining of the second organic solvent or gaps in the derivatized nanofiber sheet. On the other hand, the pressure may be lower than 0.133 kPa (1 mmHg), but it requires large-scale facilities for reducing pressure.

The treatment temperature for substitution under reduced pressure is preferably 0° C. or higher and more preferably 10° C. or higher. A temperature lower than 0° C. may lead to insufficient removal of medium liquid, resulting in remaining of the second organic solvent or gaps in the nanofiber. The upper limit of the temperature is preferably the boiling point (that under the reduced pressure) of the solvent used as the liquid material for impregnation. A temperature higher than this boiling point accelerates volatilization of the solvent, which tends to readily cause air bubbles.

Furthermore, the liquid material for impregnation can infiltrate smoothly into the derivatized nanofiber sheet by repeating reduction of pressure and pressurizing alternately in the condition that the derivatized nanofiber sheet is immersed in the liquid material for impregnation.

The reduced pressure conditions in this case are similar to the above, and a pressure of 1.1 to 10 MPa is preferred. A pressurized state that is lower than 1.1 MPa leads to insufficient infiltration of the liquid material for impregnation, resulting in remaining the second organic solvent or gaps in the nanofiber. On the other hand, the pressurized state may be higher than 10 MPa, but it requires large-scale facilities for pressurizing.

The treatment temperature of the impregnation step under pressurized state is preferably 0 to 300° C. and more preferably 10 to 100° C. A temperature that is lower than 0° C. leads to insufficient infiltration of the liquid material for impregnation, resulting in remaining the second organic solvent or gaps in the nanofiber. On the other hand, a temperature higher than 300° C. may cause degeneration of the matrix material.

In the immersion of the derivatized nanofiber sheet in the liquid material for impregnation, a laminate of a plurality of derivatized nanofiber sheets may be immersed in the liquid material for impregnation. Alternatively, a laminate of a plurality of the derivatized nanofiber sheets after the impregnation with the liquid material for impregnation may be applied to the subsequent curing step.

EXAMPLES

The present invention will now be described more specifically with reference to Examples and Comparative Examples, but is not limited to the following Examples within the scope of the present invention. The physical characteristics of the nanofiber sheet, amorphous synthetic resin, and fiber/resin composite material are measured by the following methods.
[Parallel Light Transmittance]
Measurement Apparatus "UV-4100 Spectrophotometer" (solid sample measurement system) manufactured by Hitachi High-Technologies Corp. was used.
Measurement Conditions A light-source mask having a size of 6 mm by 6 mm was used.

A test sample was placed at a position 22 cm apart from an opening of an integrating sphere, and photometry was performed. Since the sample is placed at the above position, diffuse transmission light is removed, and only linearly transmitted light directly reaches a light-receiving portion inside the integrating sphere.

A reference sample was not used. Since the reference is not present, a loss in transmittance caused by the Fresnel reflection occurs. The reference herein is reflection caused by the difference in refractive index between the sample and the air. When the Fresnel reflection occurs, a parallel light transmittance of 100% cannot be obtained.
 Light source: iodine-tungsten lamp
 Sample thickness: 100 μm
 Measurement wavelength: 600 Nm
[Coefficient of Linear Thermal Expansion]

Measurement was performed by a method in accordance with ASTM D 696 under the following conditions by using "TMA/SS6100" manufactured by Seiko Instrument Inc.
Measurement Conditions
 Temperature rising rate: 5° C./min
 Atmosphere: $N_2$ atmosphere
 Heating temperature: 20 to 150° C.
 Load: 3 mg
 Times of measurement: 3 times
 Length of sample: 4×15 mm
 Mode: tensile mode
[Young's Modulus]

A tensile test of a molded plate with a width of 5 mm, a length of 50 mm, and a thickness of 100 μm was conducted at a deformation rate of 5 mm/min with reference to JIS K7161, and the Young's modulus was determined from the stress to strain in the region not higher than the proportional limit.

The thickness was measured with a dial gauge.
[Coefficient of Moisture Absorption]
(1) A sample was left standing in a dry atmosphere at 50° C. for 24 hours, and then the weight of the sample was measured (dried weight $W_0$).
(2) The sample was left standing in an atmosphere having a humidity of 60% at 20° C. till the weight was constant, and the weight was measured (moisture weight $W_1$).
(3) The coefficient of moisture absorption was calculated based on the wet weight $W_0$ and the moisture weight $W_1$ by the following equation:

$$\text{Coefficient of moisture absorption}(\%)=[(W_1-W_0)/W_0]\times 100.$$

[Heat-Resistant Temperature]

Temperature was monitored by thermogravimetric analysis, and the temperature at which the weight started to decrease was defined as a heat-resistant temperature.
 Measurement apparatus: 2950TGA (TA Instruments)
 Measurement conditions: 10 mg of a sample was heated to 110° C. under a nitrogen gas flow, maintained at the temperature for 10 minutes, and then heated to 500° C. at a temperature raising rate of 10° C./min.
[Warp and Wave]

In a region of 5 cm by 5 cm of each fiber/resin composite material samples placed on a flat face, a sample having warps or waves not larger than 1 mm was rated as good (○), and a sample having warps or waves larger than 1 mm was rated as poor (x)

The fiber occupancy, lignin content, and other physical characteristics are as described above.

Example 1

Wood flour derived from *Pinus radiata* and having a major axis of 500 μm, a ratio of (major axis)/(minor axis) of 10, and an amount of water of 5 wt % was degreased with an ethanol-benzene mixture (ethanol:benzene=1:2 v/v). Then, 10 g of the degreased wood flour was put in a solution of 600 mL of distilled water, 4 g of sodium chlorite, and 0.8 mL of glacial acetic acid, followed by heating for one hour in a hot-water bath at 70 to 80° C. with occasional stirring. After one hour, without cooling, 4 g of sodium chlorite and 0.8 mL of glacial acetic acid were further added to the mixture, and the treatment was repeated. This procedure was repeated five times in total.

Then, the wood flour was washed with about 5 L of cold water and about 500 mL of acetone.

Then, 10 g of the wood flour was immersed in a 5 wt % potassium hydroxide aqueous solution, left standing at room temperature overnight, and then was collected by suction filtration. The collected wood flour was washed with about 2 L of water for neutralization.

The wood flour that was thus subjected to removal of lignin and hemicellulose was mechanically fibrillated by grinding treatment under the following conditions. The grinding treatment was conducted only once.

[Grinding Treatment]
Apparatus model: "Cerendipitor" model MKCA6-3, Masuko Sangyo Co., Ltd.
Grind stone grade: MKG-C 80#
Grind stone diameter: 15 cm
Distance between grind stones: grind stones were spaced by 200 μm from each other at a position where the grind stones were sufficiently pressed to each other. The distance between faces obtained by averaging asperities on the surfaces of the grind stones was 200 μm.
Rotational velocity: 1500 rpm
Single detention time: 15 minutes in 1 L of suspension containing 1% fiber
Temperature: 50 to 60° C.

The resulting water-containing nanofiber was placed between filter paper to remove water and was formed into a sheet-like shape, and was further hot-pressed at 2 MPa for 4 minutes at 120° C. for completely removing water and was formed into a dried nanofiber sheet with a thickness of 80 μm.

The resulting nanofiber sheet was cut into a size of 3 by 4 cm and immersed in an acrylic resin (TCDDMA) manufactured by Mitsubishi Chemical Corp. and left standing under reduced pressure for 12 hours. Then, the nanofiber sheet impregnated with the resin was hardened by irradiation with ultraviolet light using a belt-conveyor-type UV-irradiation apparatus (manufactured by Fusion Systems Ltd., Fusion F300 and LC6B bench top conveyor). The total irradiation energy density was 20 J/cm$^2$. The nanofiber sheet was annealed (heating treatment) in vacuum at 160° C. for 2 hours.

The resulting fiber/resin composite material contains 60 wt % of the resin.

Table 2 shows the minimum amount of water of the wood flour before the grinding treatment and the various physical characteristics of the resulting nanofiber sheet and the fiber/resin composite material.

Comparative Example 1

A nanofiber sheet and a fiber-reinforced composite material were produced as in Example 1 except that the grinding treatment was repeated ten times. Table 2 shows the resulting physical characteristics.

Comparative Example 2

A nanofiber sheet and a fiber-reinforced composite material were produced as in Example 1 except that the wood flour was dried before the grinding treatment. Table 2 shows the resulting physical characteristics.

Comparative Example 3

A nanofiber sheet and a fiber-reinforced composite material were produced as in Example 1 except that cotton linter was used instead of the wood flour and lignin and hemicellulose were not removed. Table 2 shows the resulting physical characteristics.

Comparative Example 4

A nanofiber sheet and a fiber-reinforced composite material were produced as in Comparative Example 3 except that the grinding treatment was repeated ten times. Table 2 shows the resulting physical characteristics.

Comparative Example 5

Lyophilized *Acetobacter* strain was put in a culture medium and statically cultured (at 25 to 30° C.) for one week. Among bacterial cellulose pellicles produced on the surface of the culture medium, those having a relatively large thickness were selected. A small amount of the culture medium of the selected strain was put in a flesh culture medium. This culture medium was placed in a large incubator and statically cultured for 7 to 30 days at 25 to 30° C. The culture medium was an aqueous solution (SH medium) containing 2 wt % of glucose, 0.5 wt % of bactoyeast extract, 0.5 wt % of bactoheptone, 0.27 wt % of di-sodium hydrogen phosphate, 0.115 wt % of citric acid, and 0.1 wt % of magnesium sulfate heptahydrate and having a pH of 5.0 adjusted with hydrochloric acid.

The resulting bacterial cellulose was extracted from the culture medium and boiled in a 2 wt % alkaline aqueous solution for two hours. The bacterial cellulose took out from the alkaline treatment solution and was sufficiently washed with water for removing the alkaline treatment solution and for removing the bacteria in the bacterial cellulose by dissolving. Then, the resulting water-containing bacterial cellulose (bacterial cellulose with a moisture content of 95 to 99 wt %) was hot-pressed at 2 MPa for 3 minutes at 120° C. to give a bacterial cellulose (hereinafter, referred to as "BC") sheet (a moisture content of 0 wt %) with a thickness of about 80 μm.

A fiber/resin composite material was produced as in Example 1 except that this BC sheet was used as the nanofiber sheet. Table 2 shows the resulting physical characteristics.

Comparative Example 6

A nanofiber sheet and a fiber-reinforced composite material were produced using the bacterial cellulose prepared in Comparative Example 5 and containing 95 to 99 wt % of water after the removal of the bacteria, as in Example 1 except that the grinding treatment was repeated ten times. Table 2 shows the resulting physical characteristics.

Example 2

A nanofiber sheet and a fiber-reinforced composite material were produced as in Example 1 except that the resulting water-containing nanofiber sheet was subjected to the following acetylation treatment A in the production of the nanofiber sheet. Table 2 shows the resulting physical characteristics.

[Acetylation Treatment A]
(1) The water-containing nanofiber sheet (10×10 cm) was cold-pressed at 2 MPa for 1 minute at room temperature for removing water to give a thickness of 1 mm;
(2) The pressed nanofiber sheet was immersed in acetone for completely removing the water in the nanofiber sheet. The resulting solvent-substituted nanofiber sheet was hot-pressed at 2 MPa for 3 minutes at 110° C.;
(3) A reaction solution containing 3 mL of butyric anhydride, 40 mL of acetic acid, 50 mL of toluene, and 0.2 mL of 60 wt % perchloric acid was prepared in a separable flask;
(4) The nanofiber sheet prepared in the above (2) was immersed in the reaction solution prepared in the above (3) for a reaction at room temperature for 1 hour; and
(5) After the completion of the reaction, the resulting acetylated nanofiber sheet was washed with methanol for completely removing the reaction solution in the nanofiber sheet.

Example 3

A nanofiber sheet and a fiber-reinforced composite material were produced as in Example 1 except that the resulting water-containing nanofiber sheet was subjected to the following acetylation treatment B in the production of the nanofiber sheet. Table 2 shows the resulting physical characteristics.

[Acetylation Treatment B]

(1) The water-containing nanofiber sheet (10×10 cm) was hot-pressed at 2 MPa for 4 minutes at 120° C. for completely removing water to give a dried nanofiber sheet with a thickness of 40 μm;

(2) A reaction solution containing 3 mL of butyric anhydride, 40 mL of acetic acid, 50 mL of toluene, and 0.2 mL of 60 wt % perchloric acid was prepared in a separable flask;

(3) The nanofiber sheet prepared in the above (2) was immersed in the reaction solution prepared in the above (3) for a reaction at room temperature for 1 hour;

(4) After the completion of the reaction, the resulting acetylated nanofiber sheet was washed with methanol for completely removing the reaction solution in the nanofiber sheet; and (5) The drying was carried out by pressing at 2 MPa for 4 minutes at 100° C.

Comparative Example 7

A nanofiber sheet and a fiber-reinforced composite material were produced as in Comparative Example 2 except that the resulting water-containing nanofiber sheet was subjected to the acetylation treatment B as in Example 3 in the production of the nanofiber sheet. Table 2 shows the resulting physical characteristics.

Comparative Example 8

A nanofiber sheet and a fiber-reinforced composite material were produced as in Comparative Example 3 except that the resulting water-containing nanofiber sheet was subjected to the acetylation treatment A as in Example 2 in the production of the nanofiber sheet. Table 2 shows the resulting physical characteristics.

Comparative Example 9

A nanofiber sheet and a fiber-reinforced composite material were produced as in Comparative Example 4 except that the resulting water-containing nanofiber sheet was subjected to the acetylation treatment B as in Example 3 in the production of the nanofiber sheet. Table 2 shows the resulting physical characteristics.

TABLE 2

| | | Example | | | Comparative Example | | | | | | | | |
|---|---|---|---|---|---|---|---|---|---|---|---|---|---|
| | | 1 | 2 | 3 | 1 | 2 | 3 | 4 | 5 | 6 | 7 | 8 | 9 |
| | Nanofiber sheet raw material | Wood flour | Wood flour | Wood flour | Wood flour | Wood flour | Cotton | Cotton | BC | BC | Wood flour | Cotton | Cotton |
| | Minimum water content (wt %) before grinding treatment | 5 | 5 | 5 | 5 | 0.5 | 5 | 5 | 3 | 3 | 0.5 | 5 | 5 |
| | Number of times of grinding treatment | 1 | 1 | 1 | 10 | 1 | 1 | 10 | 0 | 10 | 1 | 1 | 10 |
| Nanofiber sheet | volume fraction of Fiber (vol %) | 50 | 50 | 50 | 50 | 50 | 50 | 50 | 50 | 50 | 50 | 50 | 50 |
| | Lignin content (wt %) | 3 | 3 | 3 | 3 | 3 | 0 | 0 | 0 | 0 | 3 | 0 | 0 |
| | Hemicellulose content (wt %) | 7 | 7 | 7 | 7 | 7 | 0 | 0 | 0 | 0 | 7 | 0 | 0 |
| | Cellulose crystallinity (%) | 50 | 50 | 50 | 40 | 50 | 70 | 40 | 60 | 45 | 50 | 70 | 40 |
| | Parallel light transmittance (%) | 20 | 20 | 20 | 18 | 9 | 9 | 20 | 1 | 12 | 9 | 9 | 20 |
| | Coefficient of linear thermal expansion (ppm/K) | 5 | 5 | 5 | 15 | 9 | 10 | 16 | 3 | 15 | 9 | 10 | 16 |
| | Young's modulus (GPa) | 7 | 7 | 7 | 3 | 6 | 6 | 3 | 7 | 4 | 6 | 6 | 3 |
| | Chemical modification Acetylation treatment | None | A | B | None | None | None | None | None | None | B | A | B |
| | Degree of substitution | — | 0.6 | 0.6 | — | — | — | — | — | — | 0.6 | 0.6 | 0.6 |
| Fiber/resin composite material | Parallel light transmittance (%) | 86 | 88 | 88 | 86 | 65 | 65 | 80 | 84 | 65 | 65 | 65 | 80 |
| | Coefficient of linear thermal expansion (ppm/K) | 13 | 17 | 13 | 25 | 20 | 18 | 25 | 12 | 20 | 20 | 18 | 25 |
| | Young's modulus (GPa) | 10 | 7 | 10 | 7 | 9 | 9 | 7 | 10 | 5 | 9 | 9 | 7 |
| | Heat-resistant temperature (° C.) | 180 | 230 | 230 | 170 | 180 | 190 | 170 | 180 | 180 | 230 | 230 | 230 |
| | Coefficient of moisture absorption (%) | 3 | 1 | 1 | 5 | 6 | 3 | 5 | 3 | 5 | 1 | 1 | 1 |
| | Warp and wave | ○ | ○ | ○ | ○ | ○ | ○ | ○ | X | X | ○ | ○ | ○ |

The followings are confirmed from Table 2.

In Example 1 where the wood flour containing a minimum amount of water of 5 wt % was subjected to grinding treatment once, the nanofiber sheet contained a large amount of crystalline cellulose and had a high parallel light transmittance, a low coefficient of linear thermal expansion, and a high Young's modulus. The fiber/resin composite material prepared from this nanofiber sheet also had a high parallel light transmittance, a low coefficient of linear thermal expansion, and a high Young's modulus, and had no problems of a warp and a wave.

In Example 2 or 3 where the nanofiber sheet was further subjected to acetylation, the nanofiber sheet had a further lower coefficient of linear thermal expansion, and the resulting fiber/resin composite material had improved heat resistance and hygroscopicity.

In Comparative Example 1 where the wood flour was subjected to excess grinding treatment, the crystalline cellulose was broken, the coefficient of linear thermal expansion was high, and the Young's modulus was low. In Comparative Example 2 where the wood flour was dried before the grinding treatment, the wood flour could not be sufficiently fibrillated to a nano-scale by the grinding treatment only once. Therefore, the parallel light transmittance was low, and the coefficient of linear thermal expansion was high. In Comparative Example 7 where the nanofiber sheet was further acetylated, the coefficient of linear thermal expansion and the parallel light transmittance were not improved.

In Comparative Examples 3 and 4, cotton was used as the raw material. In Comparative Example 3 where the grinding treatment was carried out once, the fibrillation to a nano-scale was insufficient. Therefore, the parallel light transmittance was low, and the coefficient of linear thermal expansion was high. In Comparative Example 4 where the grinding treatment was repeated ten times, the parallel light transmittance was high, but the coefficient of linear thermal expansion was high and the Young's module was low, due to the breakage of the crystalline cellulose. In Comparative Examples 8 and 9 where the nanofiber sheets were further acetylated, the coefficient of linear thermal expansion was slightly improved, but a sufficient effect was not achieved.

In Comparative Examples 5 and 6, BC was used as the raw material. In Comparative Example 5 where the grinding treatment was not carried out, the parallel light transmittance, the coefficient of linear thermal expansion, and the Young's modulus were satisfactory, but there were problems of warps and waves. In Comparative Example 6 where the grinding treatment was carried out, the crystalline cellulose was broken, which further leads to unsatisfactory parallel light transmittance, coefficient of linear thermal expansion, and Young's modulus.

Although the present invention has been described in detail with reference to certain embodiments, it is obvious to those skilled in the art that various modifications can be made without departing from the spirit and scope of the present invention.

The present application is based on Japanese Patent Application (Patent Application No. 2006-197106) filed on Jul. 19, 2006, the entire content of which is hereby incorporated by reference.

The invention claimed is:

1. A nonwoven fabric consisting of nanofibers, wherein the nanofibers comprise:
   (a) 50% by weight or more, based on the total weight of the nanofibers, of crystalline cellulose, and
   (b) 10 ppm to 10% by weight, based on the total weight of the nanofibers, of lignin, wherein
   (1) the fabric has a nanofiber occupancy of 5 to 50% by volume, and
   (2) the fabric has a parallel light transmittance of 12% or more at a thickness of 100 μm.

2. The nonwoven fabric of claim 1, wherein the nanofibers are obtained from wood flour.

3. The nonwoven fabric of claim 1, wherein the nanofiber has hydroxyl groups and a part of hydroxyl groups of the nanofiber is chemically modified.

4. The nonwoven fabric of claim 3, wherein the chemical modification is acylation.

5. The nonwoven fabric of claim 3, wherein a degree of substitution in the nanofiber by the chemical modification is 0.05 to 1.2.

6. A method of producing the nonwoven fabric of claim 1, comprising mechanically fibrillating a nanofiber precursor, wherein the nanofiber precursor contains 5 wt % or more water in all steps prior to the fibrillation.

7. The method of claim 6, wherein a nanofiber precursor solution or dispersion containing 0.1 to 5 wt % solid content is mechanically fibrillated to give nanofiber.

8. The method of claim 7, wherein the fibrillation step is carried out after a step of removing lignin by immersing the nanofiber precursor in an oxidizer.

9. The method of claim 8, wherein the oxidizer is a sodium chlorite aqueous solution.

10. The method of claim 6, wherein the fibrillation step is a grinding treatment.

11. The method of claim 10, wherein the grinding treatment is carried out by using plate-like grind stones with a diameter of 10 cm or more facing to each other with a clearance of 1 mm or less under conditions including a revolution number of the grind stones of 500 rpm or more and a detention time of the nanofiber precursor between the grind stones of one to thirty minutes.

12. The method of claim 6, further comprising drying the nanofiber obtained in the fibrillation step to an amount of water of less than 3 wt %.

13. The method of claim 6, further comprising a hemicellulose-removing step of immersing the nanofiber precursor in an alkali.

14. The method of claim 13, wherein the alkali is a potassium hydroxide aqueous solution.

15. The method of claim 6, further comprising a papermaking step of papermaking the nanofiber obtained in the fibrillation step.

16. The method of claim 15, further comprising chemically modifying a part of hydroxyl groups of the nanofiber obtained in the fibrillation step.

17. The nonwoven fabric of claim 3, wherein the nanofibers consist essentially of (a) and (b).

18. The nonwoven fabric of claim 3, wherein the nanofibers consist of (a) and (b).

* * * * *